(12) United States Patent
Kim et al.

(10) Patent No.: US 11,296,188 B2
(45) Date of Patent: Apr. 5, 2022

(54) SEMICONDUCTOR DEVICE AND MANUFACTURING METHOD OF SEMICONDUCTOR DEVICE

(71) Applicant: SK hynix Inc., Icheon-si (KR)

(72) Inventors: Hee Soo Kim, Suwon-si (KR); Young Ho Yang, Cheongju-si (KR); Chang Soo Lee, Cheongju-si (KR); Wan Sup Shin, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/791,472

(22) Filed: Feb. 14, 2020

(65) Prior Publication Data
US 2021/0036109 A1 Feb. 4, 2021

(30) Foreign Application Priority Data

Aug. 1, 2019 (KR) ........................ 10-2019-0094041

(51) Int. Cl.
| | |
|---|---|
| *H01L 29/08* | (2006.01) |
| *H01L 29/417* | (2006.01) |
| *H01L 29/36* | (2006.01) |
| *H01L 27/11556* | (2017.01) |
| *H01L 27/11582* | (2017.01) |
| H01L 29/792 | (2006.01) |
| H01L 21/3065 | (2006.01) |
| H01L 21/02 | (2006.01) |
| H01L 29/66 | (2006.01) |
| H01L 21/28 | (2006.01) |
| H01L 29/788 | (2006.01) |

(52) U.S. Cl.
CPC .... *H01L 29/0847* (2013.01); *H01L 27/11556* (2013.01); *H01L 27/11582* (2013.01); *H01L 29/36* (2013.01); *H01L 29/41741* (2013.01); H01L 21/02236 (2013.01); H01L 21/3065 (2013.01); H01L 29/40114 (2019.08); H01L 29/40117 (2019.08); H01L 29/6656 (2013.01); H01L 29/66825 (2013.01); H01L 29/66833 (2013.01); H01L 29/7883 (2013.01); H01L 29/7889 (2013.01); H01L 29/7926 (2013.01)

(58) Field of Classification Search
None
See application file for complete search history.

(56) References Cited

U.S. PATENT DOCUMENTS

2017/0084626 A1* 3/2017 Kim ................... H01L 23/485

FOREIGN PATENT DOCUMENTS

| KR | 1020160025842 A | 3/2016 |
|---|---|---|
| KR | 1020200018064 A | 2/2020 |

* cited by examiner

*Primary Examiner* — Robert K Carpenter
(74) *Attorney, Agent, or Firm* — William Park & Associates Ltd.

(57) ABSTRACT

A semiconductor device includes a source structure, a bit line, a stacked structure between the source structure and the bit line, a source contact structure penetrating the stacked structure and electrically coupled to the source structure, and a protective pattern interposed between the source contact structure and the source structure and having a varying thickness depending on an area of the protective pattern.

12 Claims, 30 Drawing Sheets

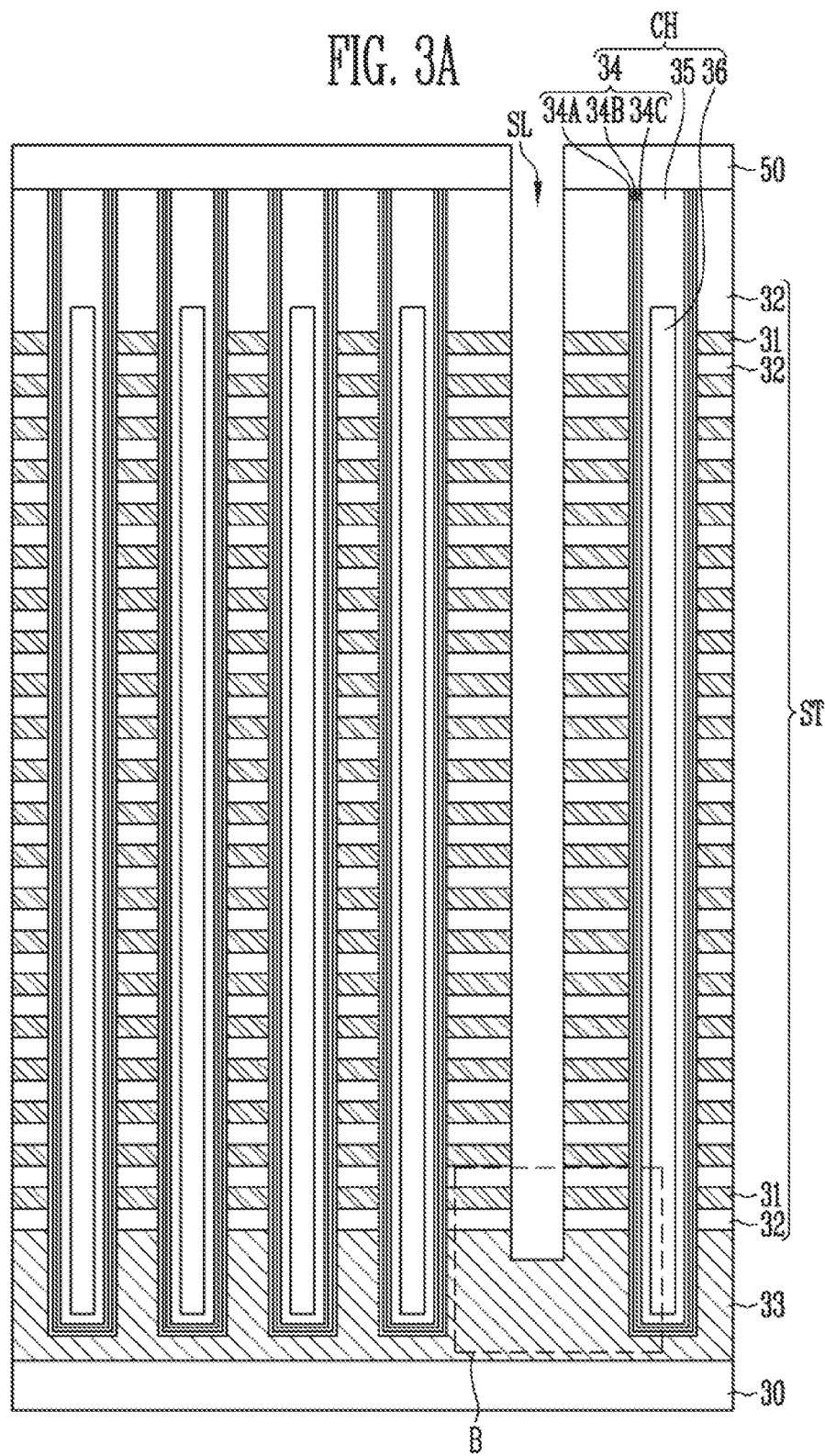

SEMICONDUCTOR DEVICE AND MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2019-0094041 filed on Aug. 1, 2019, in the Korean Intellectual Property Office, the entire disclosure of which is incorporated by reference herein.

BACKGROUND

1. Technical Field

Various embodiments relate generally to an electronic device and, more particularly, to a semiconductor device and a method of manufacturing the semiconductor device.

2. Related Art

Non-volatile memory devices retain stored data regardless of the availability of power. The increase in integration density of two-dimensional non-volatile memory devices in which memory cells are formed in a single layer over a substrate has recently been limited. Thus, three-dimensional non-volatile memory devices have been proposed in which memory cells are stacked in a vertical direction over a substrate.

A three-dimensional non-volatile memory device may include interlayer insulating layers and gate electrodes that are stacked alternately with each other, and channel layers passing therethrough, with memory cells stacked along the channel layers. Various structures and manufacturing methods have been developed to improve the operational reliability of three-dimensional non-volatile memory devices.

SUMMARY

According to an embodiment, a semiconductor device may include a source structure, a bit line, a stacked structure between the source structure and the bit line, a source contact structure penetrating the stacked structure and electrically coupled to the source structure, and a protective pattern interposed between the source contact structure and the source structure and having a varying thickness depending on an area of the protective pattern.

According to an embodiment, a semiconductor device may include a source structure including a first source layer, a second source layer, and a third source layer interposed between the first source layer and the second source layer, a bit line, a stacked structure between the source structure and the bit line, a source contact structure penetrating the stacked structure and electrically coupled to the source structure, and an insulating spacer surrounding a sidewall of the source contact structure. The semiconductor device may also include a protective pattern interposed between the insulating spacer and the source structure and covering the insulating spacer surrounded source contact structure at interfaces between the first, second, and third source layers.

According to an embodiment, a method of manufacturing a semiconductor device may include forming a source structure, forming a stacked structure over the source structure including a sacrificial layer, forming a slit passing through the stacked structure and exposing the sacrificial layer, replacing the sacrificial layer with a first source layer through the slit, forming a protective pattern having a varying thickness depending on an area of the protective pattern by selectively oxidizing the source structure through the slit, and forming a source contact structure in the slit.

A method of manufacturing a semiconductor device may include forming a source structure including a first source layer, a second source layer and a sacrificial layer interposed between the first source layer and the second source layer, forming a stacked structure including first material layers and second material layers stacked alternately over the source structure, forming a slit passing through the stacked structure and exposing the sacrificial layer, and replacing the sacrificial layer with a third source layer through the slit. The method may further include forming a protective pattern covering interfaces between the first, second, and third source layers by selectively oxidizing the first, second, and third source layers through the slit, and forming a source contact structure in the slit.

DETAILED DESCRIPTION

Hereinafter, specific structural or functional descriptions of embodiments in accordance with concepts which are disclosed in this specification are illustrated only to describe the embodiments. Concepts and embodiments in accordance with the present teachings may be realized by various forms and are not specifically limited to the embodiments described in this specification.

Various embodiments are directed to semiconductor devices and manufacturing processes for the semiconductor devices. These semiconductor devices may have stabilized structures and improved characteristics over current state-of-the-art semiconductor devices.

Figure 1:
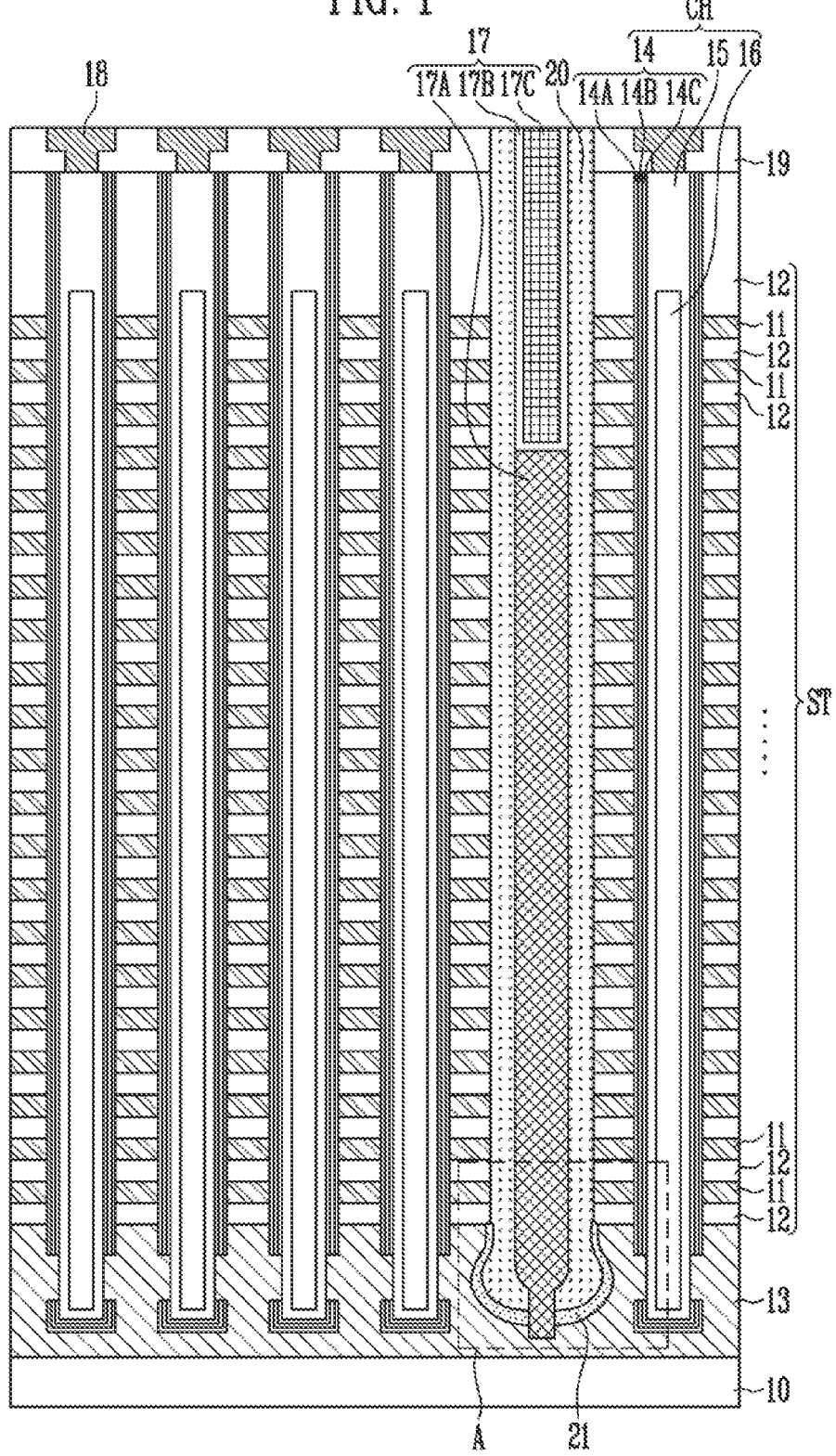
FIG. 1 is a cross-sectional diagram illustrating a structure of a semiconductor device according to an embodiment of the present disclosure.

FIG. 1 is a cross-sectional diagram illustrating the structure of a semiconductor device according to an embodiment of the present disclosure.

Referring to FIG. 1, a semiconductor device may include a source structure 13, a stacked structure ST, a channel structure CH, a source contact structure 17, a protective pattern 21, and bit lines 18. In addition, the semiconductor device may further include at least one of a base 10, a spacer 20, and an interlayer insulating layer 19.

The source structure 13 may be a conductive layer including polysilicon or metal and formed in a single layer or multilayer layers. The source structure 13 may be disposed between the base 10 and the stacked structure ST. The base 10 may be a semiconductor substrate or an insulating layer. The source structure 13 may include a dopant. The dopant may include boron (Br), phosphorus (P), arsenic (As), carbon (C), nitrogen (N), carbon (C), or a combination thereof.

The stacked structure ST may be located between the source structure 13 and the bit lines 18. The stacked structure ST may include conductive layers 11 and insulating layers 12 stacked alternately with each other. The conductive layers 11 may be select lines or word lines. The insulating layers 12 may be provided to insulate the stacked conductive layers 11 from each other and include an insulating material such as oxides or nitrides.

The channel structure CH may be coupled between the bit lines 18 and the source structure 13. The channel structure CH may pass through the stacked structure ST and extend into the source structure 13. The channel structure CH may include a channel layer 15 and further include at least one of a memory layer 14 and a gap-filling layer 16. The channel layer 15 may include a semiconductor material such as silicon (Si) and germanium (Ge). The memory layer 14 may be formed to surround a sidewall of the channel layer 15. The memory layer 14 may include at least one of a charge blocking layer 14A, a data storing layer 14B, and a tunnel insulating layer 14C. The data storing layer 14B may include a floating gate, a charge trapping material, polysilicon, nitride, a variable resistance material, a phase-change material, nanodots, or a combination thereof. The gap-filling layer 16 may be formed in the channel layer 15. The gap-filling layer 16 may include an oxide layer.

A select transistor or a memory cell may be located at an intersection between the channel structure CH and each of the conductive layers 11. A select transistor and a memory cell which share one channel layer 15 may form one memory string. A memory string may include at least one drain select transistor, a plurality of memory cells, and at least one source select transistor which are coupled in series with each other.

The source contact structure 17 may pass through the stacked structure ST and be coupled to the source structure 13. The source contact structure 17 may be a conductive layer including polysilicon, metal, or the like. The source contact structure 17 may be a single layer or multiple layers. The source contact structure 17 may include a first conductive layer 17A, a barrier layer 17B, and a second conductive layer 17C. The first conductive layer 17A may be disposed adjacent to the source structure 13 and the second conductive layer 17C may be spaced apart from the source structure 13. The barrier layer 17B may be formed to surround the second conductive layer 17C and be interposed between the first conductive layer 17A and the second conductive layer 17C. The second conductive layer 17C may include a material having a lower resistance than the first conductive layer 17A. For example, the first conductive layer 17A may include a polysilicon layer and the second conductive layer 17C may include a metal layer containing tungsten. The barrier layer 17B may include titanium (Ti), titanium nitride (TiN), tantalum (Ta), tantalum nitride (TaN), tungsten nitride (WNx), or the like.

The spacer 20 may be interposed between the source contact structure 17 and the stacked structure ST. The spacer 20 may surround a sidewall of the source contact structure 17. The spacer 20 may be an insulating spacer including an insulating layer. The spacer 20 may be a single layer or multiple layers.

The protective pattern 21 may be interposed between the source contact structure 17 and the source structure 13 and between the spacer 20 and the source structure 13. The protective pattern 21 may cover an etched surface of the source structure 13 and an interface between the source structure 13 and the stacked structure ST. The protective pattern 21 may have a varying thickness depending on an area of protective pattern. That is, different areas of the protective pattern at different locations may have different thicknesses. The protective pattern 21 may include an insulating material such as an oxide layer, and may be an insulating pattern.

FIGS. 2A to 2G are cross-sectional diagrams illustrating a structure of a semiconductor device according to an embodiment of the present disclosure. FIGS. 2A to 2G are enlarged views of an area A of FIG. 1. In the following description, repeated descriptions of certain elements that are discussed above are omitted for the sake of brevity.

Referring to FIGS. 2A to 2G, the source structure 13 may include a first source layer 13A, a second source layer 13B, and a third source layer 13C. Each of the first to third source layers 13A to 13C may be a polysilicon layer. The first source layer 13A may be spaced apart from the stacked structure ST, and the second source layer 13B may be located adjacent to the stacked structure ST. The third source layer 13C may be interposed between the first source layer 13A and the second source layer 13B.

The source structure 13 may pass through the memory layer 14 and be coupled to the channel layer 15. At least one of the first to third source layers 13A to 13C may pass through the memory layer 14 to be coupled to the channel layer 15. The third source layer 13C may pass through the memory layer 14 and directly contact the channel layer 15.

Protective patterns 21A to 21G may include first areas 21A1 to 21G1 corresponding to the first source layer 13A, second areas 21A2 to 21G2 corresponding to the second source layer 13B, and third areas 21A3 to 21G3 corresponding to the third source layer 13C. For example, the first area 21A1 of the protective pattern interfaces with the first source layer 13A. Each of the protective patterns may include the first to third areas.

Each of the protective patterns 21A to 21G may be formed by selectively oxidizing the etched surface of the source structure 13 and may contact the source structure 13. The first areas 21A1 to 21G1 may contact the first source layer 13A, the second areas 21A2 to 21G2 may contact the second source layer 13B, and the third areas 21A3 to 21G3 may contact the third source layer 13C.

Each of the protective patterns 21A to 21G may cover interfaces between the first to third source layers 13A to 13C. In addition, the protective patterns 21A to 21G may cover the interface between the source structure 13 and the stacked structure ST. When each of the second areas 21A2 to 21G2 cover the interface between the source structure 13 and the stacked structure ST, a sharp point of each of the second areas 21A2 to 21G2 may be higher than a bottom surface of the stacked structure ST.

At least an area of the protective patterns 21A to 21G may be formed by performing an oxidation process several times. For example, the second areas 21A2 to 21G2 may be formed by performing an oxidation process at least twice. In addition, the second areas 21A2 to 21G2 may have a convex shape toward the source contact structure 17.

The source structure 13 may include a dopant. At least one of the first to third source layers 13A to 13C may include a dopant at a different concentration from the other source layers, or may include different types of dopants from the remaining source layers. When the protective pattern 21 is formed by a selective oxidation process, the concentration or kind of the dopant included in each of the first to third source layers 13A to 13C may affect the thickness of each of the first, second, and third areas 21A1 to 21G1, 21A2 to 21G2, and 21A3 to 21G3.

A dopant may increase an oxidation rate or suppress oxidation. A dopant, such as phosphorus (P), arsenic (As), or boron (Br), may increase an oxidation rate. In other words, as the concentration of the dopant increases, the thickness of the protective patterns 21A to 21G may increase. A dopant, such as nitrogen (N) or carbon (C), may suppress the oxidation of the source structure 13. In other words, as the concentration of the dopant increases, the thickness of the protective patterns 21A to 21G may increase. Therefore, by controlling the concentration or kind of the dopant included in each of the first to third source layers 13A to 13C, the first, second, and third areas 21A1 to 21G1, 21A2 to 21G2, and 21A3 to 21G3 may have different thicknesses.

The source contact structure 17 may pass through the spacer 20 and the protective pattern 21 to be coupled to the source structure 13. The source contact structure 17 may be coupled to the first source layer 13A. For example, the first conductive layer 17A may directly contact the first source layer 13A.

Hereinafter, with reference to FIGS. 2A to 2G, the protective patterns 21A to 21G having various shapes will be described. In addition, for convenience of explanation, a description will be made on the assumption that the source structure 13 includes a dopant which increases an oxidation rate.

Figure 2A:
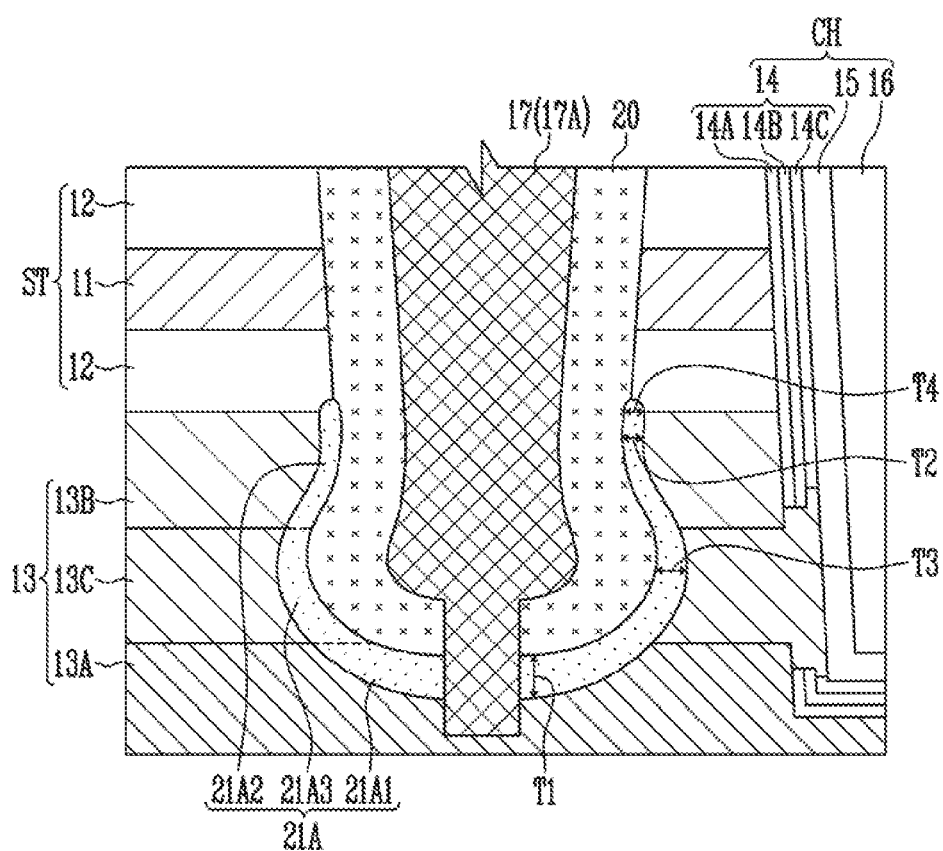
FIGS. 2A to 2G are cross-sectional diagrams illustrating a structure of a semiconductor device according to an embodiment of the present disclosure.

Referring to FIG. 2A, the first source layer 13A may include a dopant at a higher concentration than the second and third source layers 13B and 13C. In addition, the third source layer 13C may include a dopant at a higher concentration than the second source layer 13B. For various embodiments, the first source layer 13A may have a dopant concentration of 8E20 to 5E21 atoms/cm$^2$ and the third source layer 13C may have a dopant concentration of 1E20 to 1E21 atoms/cm$^2$. The second source layer 13B may be an undoped layer, or may include a dopant concentration of 5E19 to 5E20 atoms/cm$^2$. The exponential notation 8E20, for example, indicates $8 \times 10^{20}$.

The protective pattern 21A may include the first area 21A1 having a first thickness T1, the second area 21A2 having a second thickness T2, and the third area 21A3 having a third thickness T3. Each area may have a uniform thickness, or the thickness of each area may vary within the area. The thickness T1, T2, or T3 specified for each area, for example, may be the greatest thickness for the area.

The protective pattern 21A may have a thickness in proportion to the concentration of the dopant of the corresponding source layer. The first area 21A1 may have a greater thickness than the second and third areas 21A2 and 21A3 (T1>T2 and T1>T3). The third area 21A3 may have a greater thickness than the second area 21A2 (T3>T2).

For various embodiments, the thickness T1 of the first area 21A1 may range from 100 angstroms (A) to 200 Å. The thickness T2 of the second area 21A2 may range from 40 Å to 80 Å. The thickness T3 of the third area 21A3 may range from 50 Å to 80 Å. At the interface between the source structure 13 and the stacked structure ST, the protective pattern 21A may have the thickness T4 ranging from 40 Å to 80 Å.

Figure 2B:
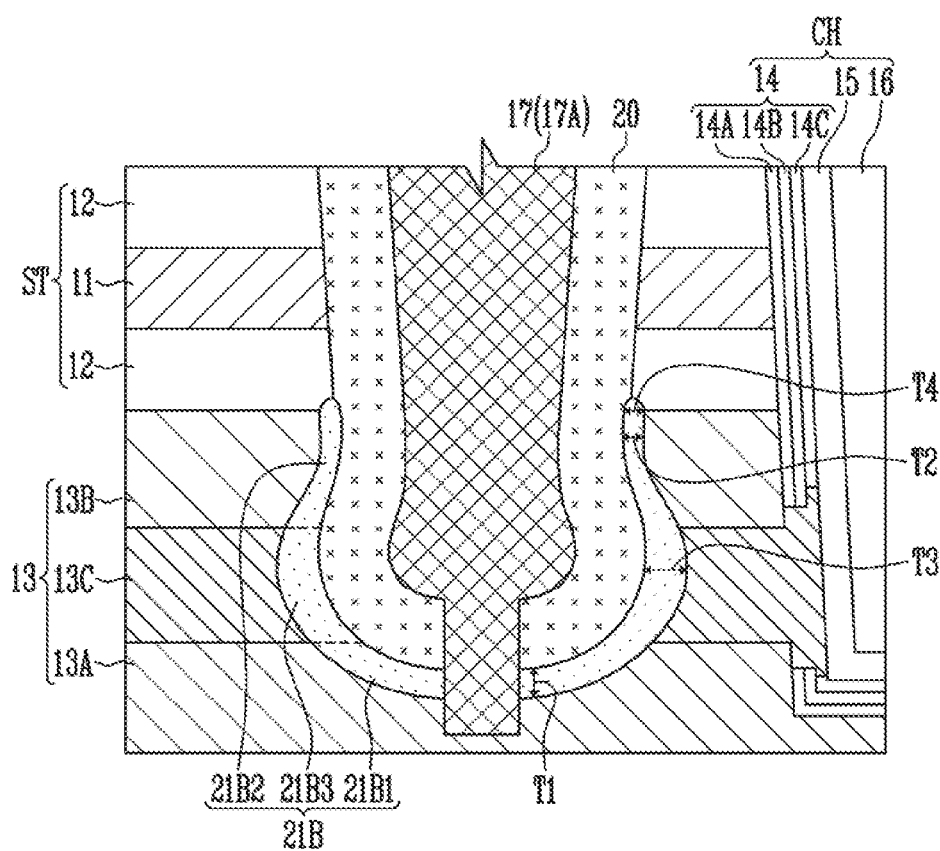

Referring to FIG. 2B, the third source layer 13C may include a dopant at a higher concentration than the first and second source layers 13A and 13B. In addition, the first source layer 13A may include a dopant at a higher concentration than the second source layer 13B. For various embodiments, the first source layer 13A may have a dopant concentration of 1E20 to 1E21 atoms/cm$^2$ and the third source layer 13C may have a dopant concentration of 18E20 to 5E21 atoms/cm$^2$. The second source layer 13B may be an undoped layer, or may include a dopant concentration of 5E19 to 5E20 atoms/cm$^2$.

The protective pattern 21B may include a first area 21B1 having the first thickness T1, a second area 21B2 having the second thickness T2, and the third area 21B3 having the third thickness T3. The third area 21B3 may have a greater thickness than the first and second areas 21B1 and 21B2 (T3>T1 and T3>T2). The first area 21B1 may have a greater thickness than the second area 21B2 (T1>T2).

For various embodiments, the thickness T3 of the third area 21B3 may range from 100 Å to 200 Å. The thickness T2 of the second area 21B2 may range from 40 Å to 80 Å. The thickness T1 of the first area 21B1 may range from 50 Å to 80 Å. At the interface between the source structure 13 and the stacked structure ST, the protective pattern 21B may have a thickness T4 ranging from 40 Å to 80 Å.

Figure 2C:
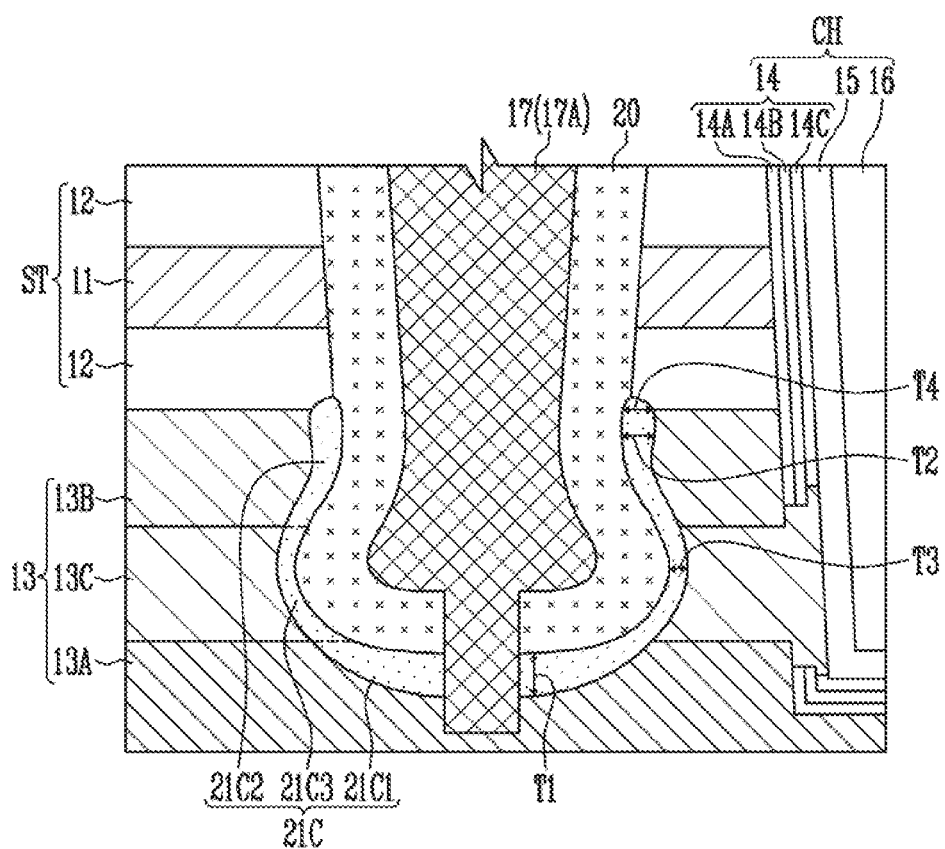

Referring to FIG. 2C, the first source layer 13A may include a dopant at a higher concentration than the second and third source layers 13B and 13C. In addition, the second source layer 13B may include a dopant at a higher concentration than the third source layer 13C. For various embodiments, the second source layer 13B may have a dopant concentration of 1E20 to 1E21 atoms/cm$^2$ and the first source layer 13A may have a dopant concentration of 18E20 to 5E21 atoms/cm$^2$. The third source layer 13C may be an undoped layer, or may include a dopant concentration of 5E19 to 5E20 atoms/cm$^2$.

The protective pattern 21C may include the first area 21C1 having the first thickness T1, the second area 21C2 having the second thickness T2, and the third area 21C3 having the third thickness T3. The first area 21C1 may have a greater thickness than the second and third areas 21C2 and 21C3 (T1>T2 and T1>T3). The second area 21C2 may have a greater thickness than the third areas 21C3 (T2>T3).

For various embodiments, the thickness T1 of the first area 21C1 may range from 100 Å to 200 Å. The thickness T3 of the third area 21C3 may range from 40 Å to 80 Å. The thickness T2 of the second area 21C2 may range from 50 Å to 80 Å. At the interface between the source structure 13 and the stacked structure ST, the protective pattern 21C may have the thickness T4 ranging from 40 Å to 80 Å.

Figure 2D:
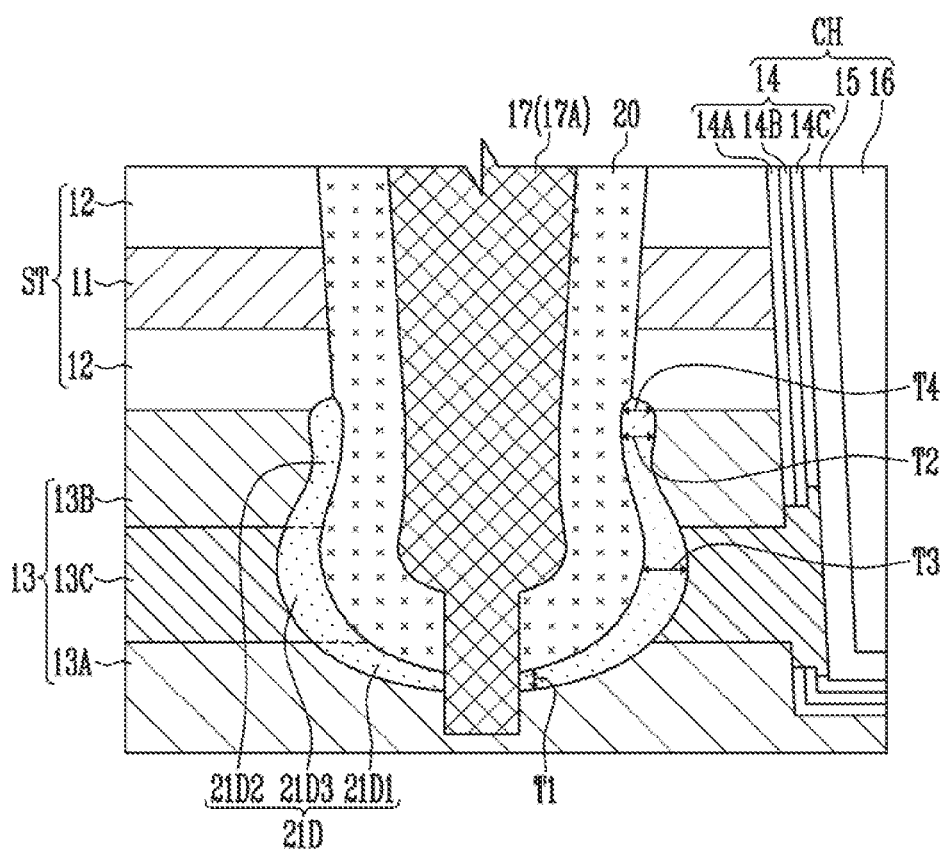

Referring to FIG. 2D, the third source layer 13C may include a dopant at a higher concentration than the first and second source layers 13A and 13B. In addition, the second source layer 13B may include a dopant at a higher concentration than the first source layer 13A. For various embodiments, the second source layer 13B may have a dopant concentration of 1E20 to 1E21 atoms/cm$^2$ and the third source layer 13C may have a dopant concentration of 18E20 to 5E21 atoms/cm$^2$. The first source layer 13A may be an undoped layer, or may include a dopant concentration of 5E19 to 5E20 atoms/cm$^2$.

The protective pattern 21D may include the first area 21D1 having the first thickness T1, the second area 21D2 having the second thickness T2, and the third area 21D3 having the third thickness T3. The third area 21D3 may have a greater thickness than the first and second areas 21D1 and 21D2 (T3>T1 and T3>T2). The second area 21D2 may have a greater thickness than the first area 21D1 (T2>T1).

For various embodiments, the thickness T3 of the third area 21D3 may range from 100 Å to 200 Å. The thickness T1 of the first area 21D1 may range from 40 Å to 80 Å. The thickness T2 of the second area 21D2 may range from 50 Å to 80 Å. At the interface between the source structure 13 and the stacked structure ST, the protective pattern 21D may have the thickness T4 ranging from 40 Å to 80 Å.

Figure 2E:
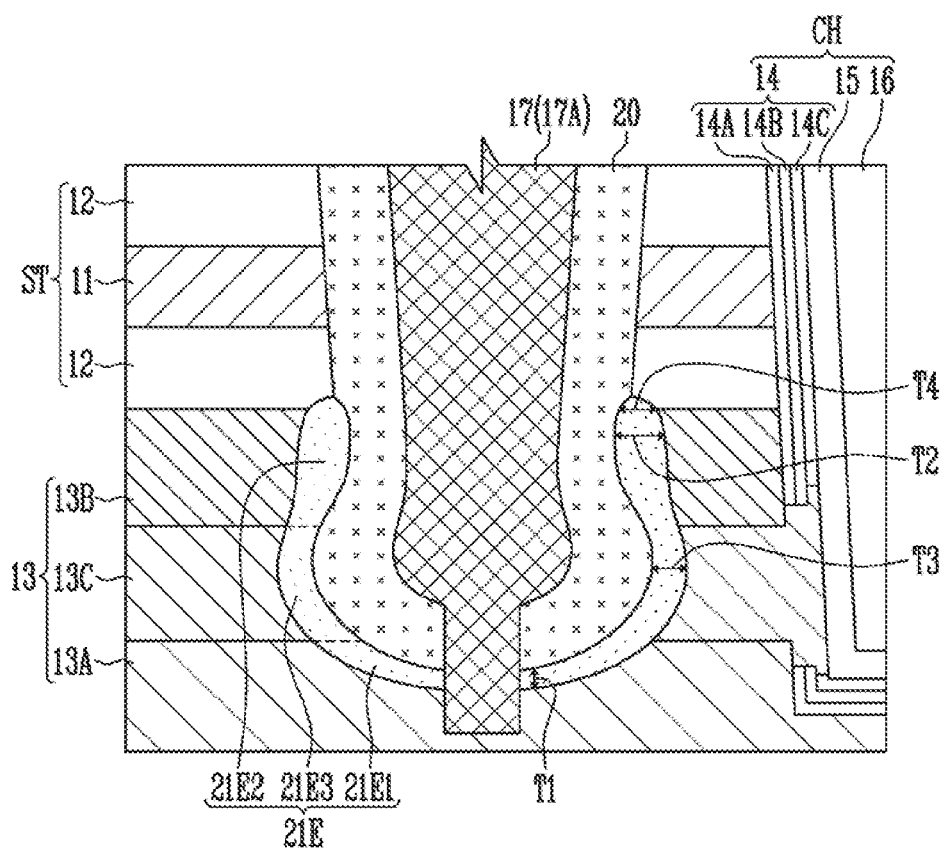

Referring to FIG. 2E, the second source layer 13B may include a dopant at a higher concentration than the first and third source layers 13A and 13C. In addition, the third source layer 13C may include a dopant at a higher concentration than the first source layer 13A. For various embodiments, the third source layer 13C may have a dopant concentration of 1E20 to 1E21 atoms/cm$^2$ and the second source layer 13B may have a dopant concentration of 18E20 to 5E21 atoms/cm$^2$. The first source layer 13A may be an undoped layer, or may include a dopant concentration of 5E19 to 5E20 atoms/cm$^2$.

The protective pattern 21E may include the first area 21E1 having the first thickness T1, the second area 21E2 having the second thickness T2, and the third area 21E3 having the third thickness T3. The second area 21E2 may have a greater thickness than the first and third areas 21E1 and 21E3 (T2>T1 and T2>T3). The third area 21E3 may have a greater thickness than the first area 21E1 (T3>T1).

For various embodiments, the thickness T2 of the second area 21E2 may range from 100 Å to 200 Å. The thickness T1 of the first area 21E1 may range from 40 Å to 80 Å. The thickness T3 of the third area 21E3 may range from 50 Å to 80 Å. At the interface between the source structure 13 and the stacked structure ST, the protective pattern 21E may have the thickness T4 ranging from 40 Å to 80 Å.

Figure 2F:
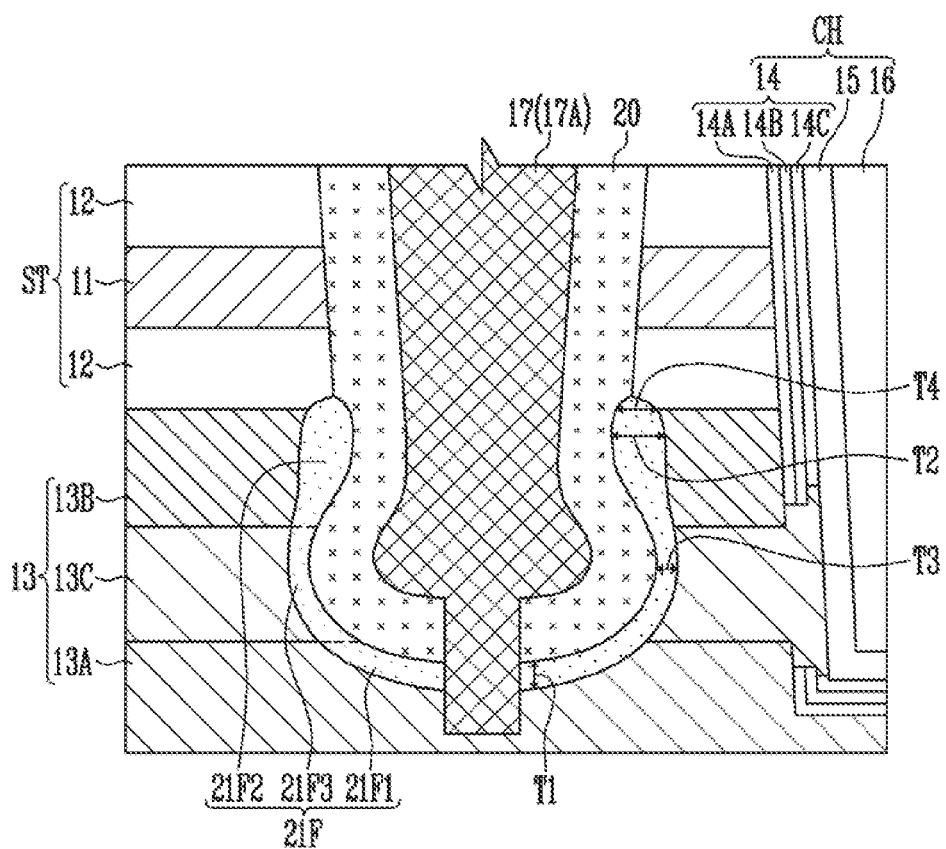

Referring to FIG. 2F, the second source layer 13B may include a dopant at a higher concentration than the first and third source layers 13A and 13C. In addition, the first source layer 13A may include a dopant at a higher concentration than the third source layer 13C. For various embodiments, the first source layer 13A may have a dopant concentration of 1E20 to 1E21 atoms/cm$^2$ and the second source layer 13B may have a dopant concentration of 18E20 to 5E21 atoms/cm$^2$. The third source layer 13C may be an undoped layer, or may include a dopant concentration of 5E19 to 5E20 atoms/cm$^2$.

The protective pattern 21F may include the first area 21F1 having the first thickness T1, the second area 21F2 having the second thickness T2, and the third area 21F3 having the third thickness T3. The second area 21F2 may have a greater thickness than the first and third areas 21F1 and 21F3 (T2>T1 and T2>T3). The first area 21F1 may have a greater thickness than the third area 21F3 (T1>T3).

For various embodiments, the thickness T2 of the second area 21F2 may range from 100 Å to 200 Å. The thickness T3 of the third area 21F3 may range from 40 Å to 80 Å. The thickness T1 of the first area 21F1 may range from 50 Å to 80 Å. At the interface between the source structure 13 and the stacked structure ST, the protective pattern 21F may have the thickness T4 ranging from 40 Å to 80 Å.

Figure 2G:
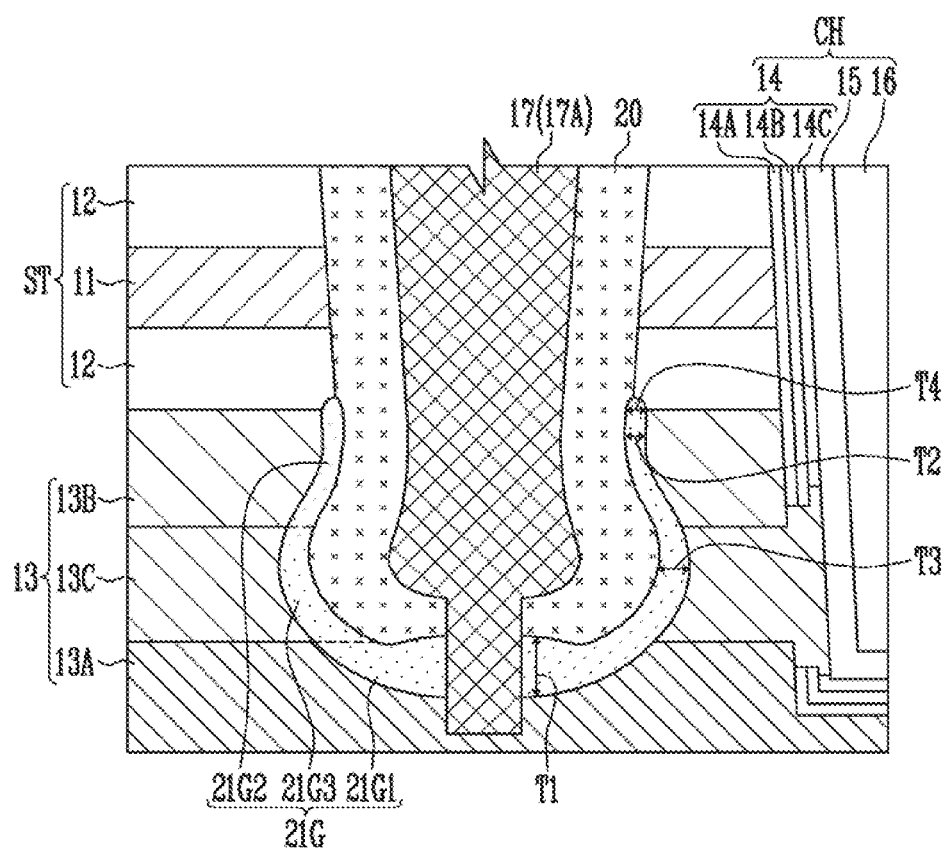

Referring to FIG. 2G, the first source layer 13A may include a dopant at a higher concentration than the second and third source layers 13B and 13C. In addition, the third source layer 13C may include a dopant at a higher concentration than the second source layer 13B. For various embodiments, the third source layer 13C may have a dopant concentration of 1E20 to 1E21 atoms/cm$^2$ and the first source layer 13A may have a dopant concentration of 18E20 to 5E21 atoms/cm$^2$. The second source layer 13B may be an undoped layer, or may include a dopant concentration of 5E19 to 5E20 atoms/cm$^2$.

The protective pattern 21G may include the first area 21G1 having the first thickness T1, the second area 21G2 having the second thickness T2, and the third area 21G3 having the third thickness T3. The first area 21G1 may have a greater thickness than the second and third areas 21G2 and 21G3 (T1>T2 and T1>T3). The third area 21G3 may have a greater thickness than the second areas 21G2 (T3>T2).

The first area 21G1 may have the greatest thickness at an interface with the source contact structure 17. For various embodiments, the thickness T1 of the first area 21G1 may range from 100 Å to 200 Å. The thickness T2 of the second area 21G2 may range from 40 Å to 80 Å. The thickness T3 of the third area 21G3 may range from 50 Å to 80 Å. At the interface between the source structure 13 and the stacked structure ST, the protective pattern 21G may have the thickness T4 ranging from 40 Å to 80 Å.

Figure 3B:
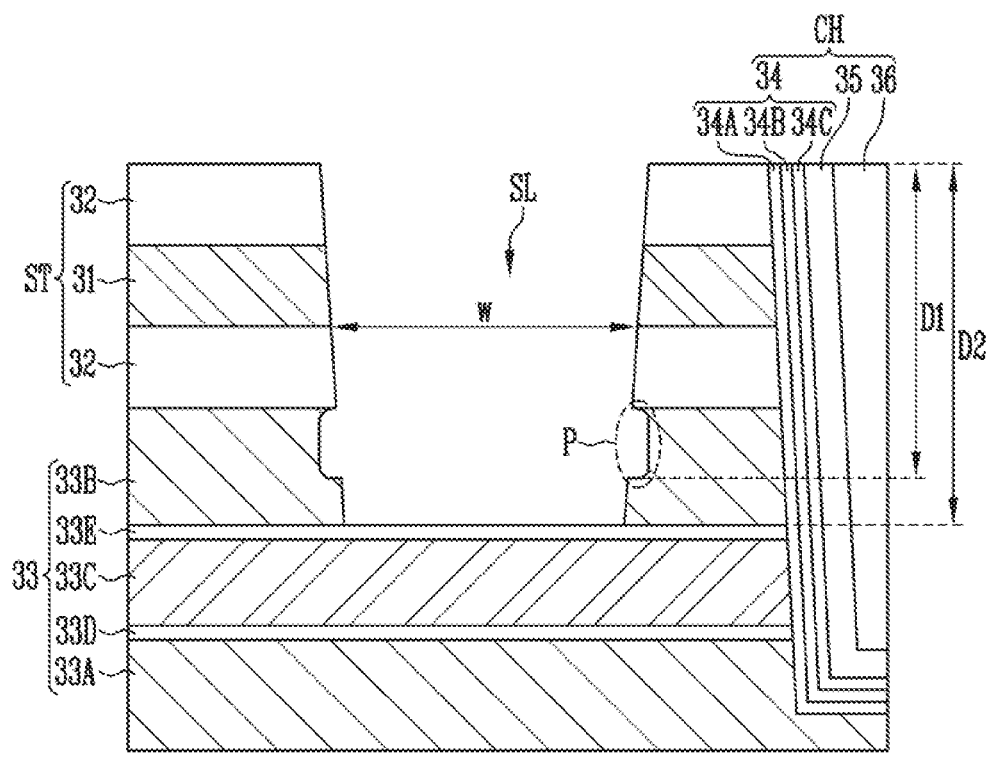
FIGS. 3A to 3R are cross-sectional views illustrating a method of manufacturing a semiconductor device according to an embodiment of the present disclosure.
Figure 3C:
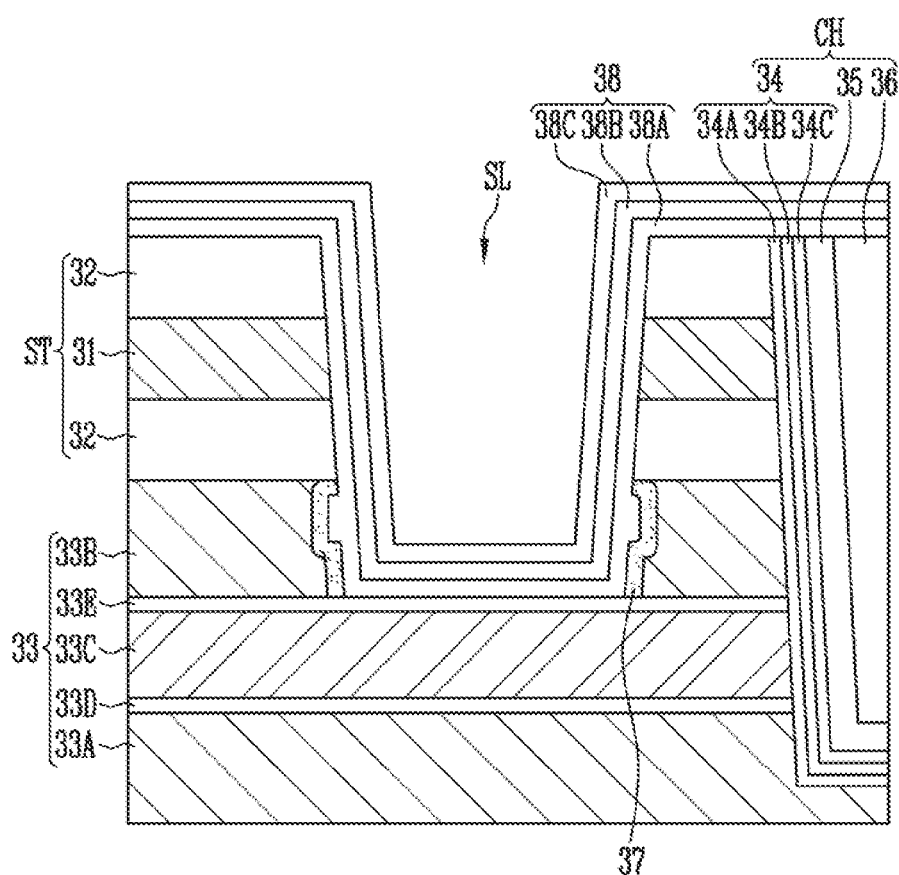
Figure 3D:
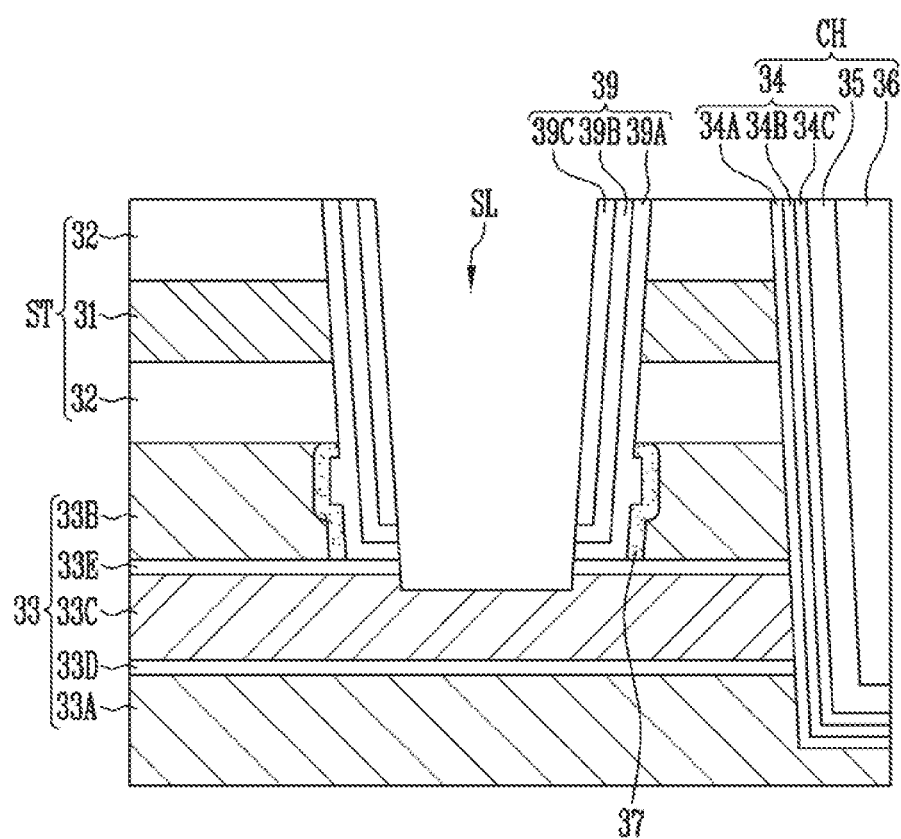
Figure 3E:
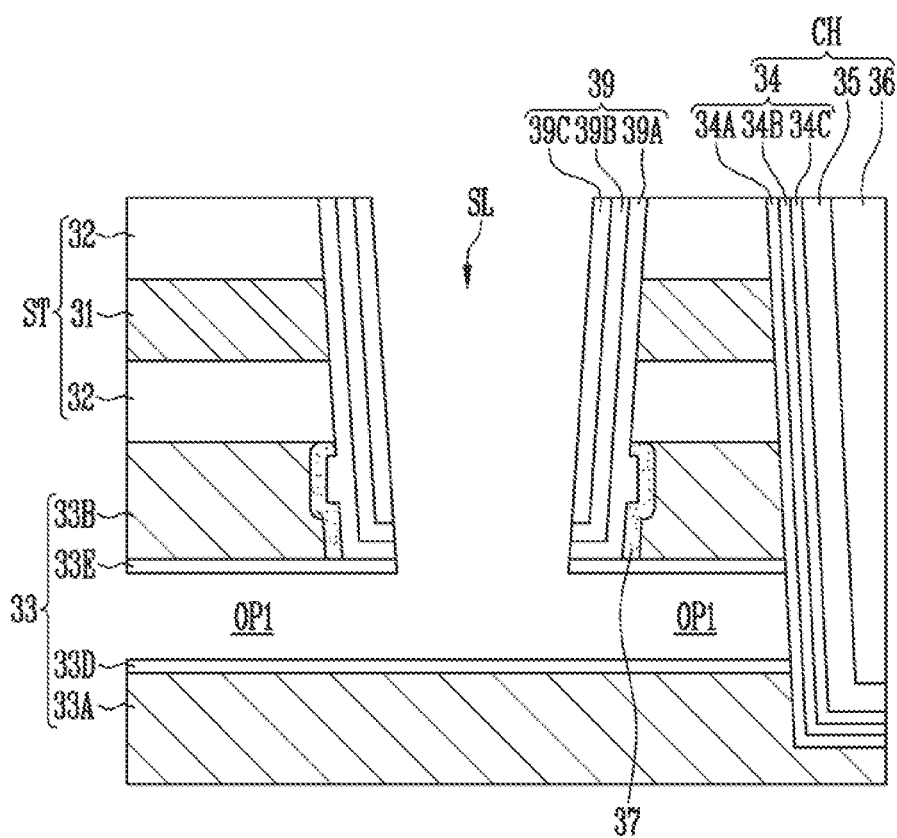
Figure 3F:
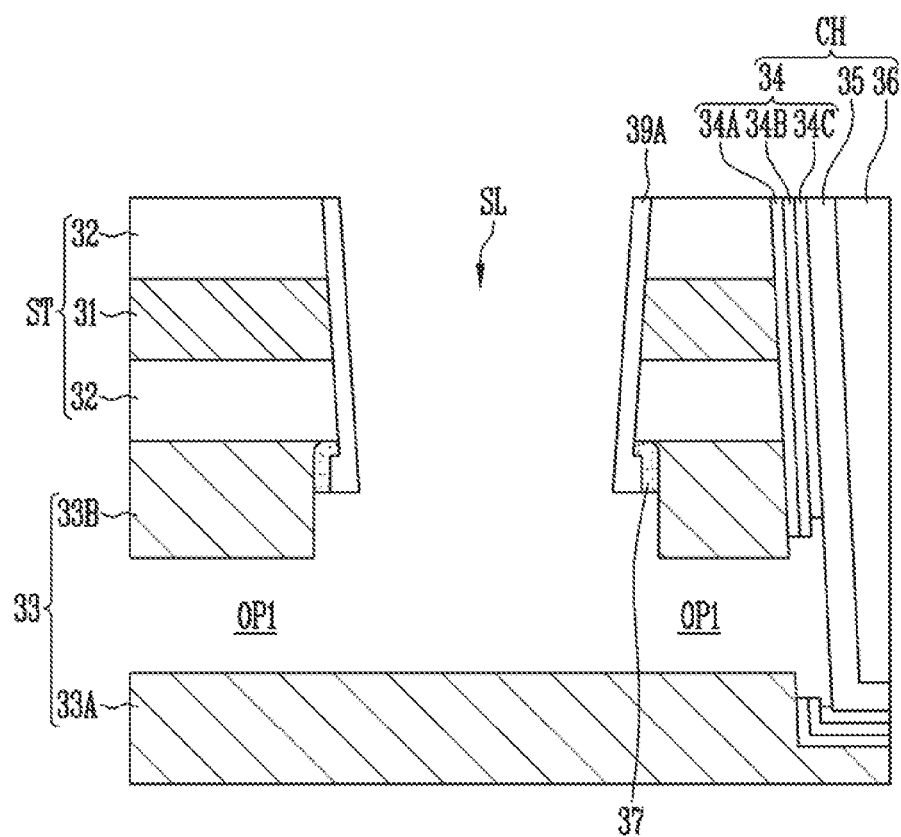
Figure 3G:
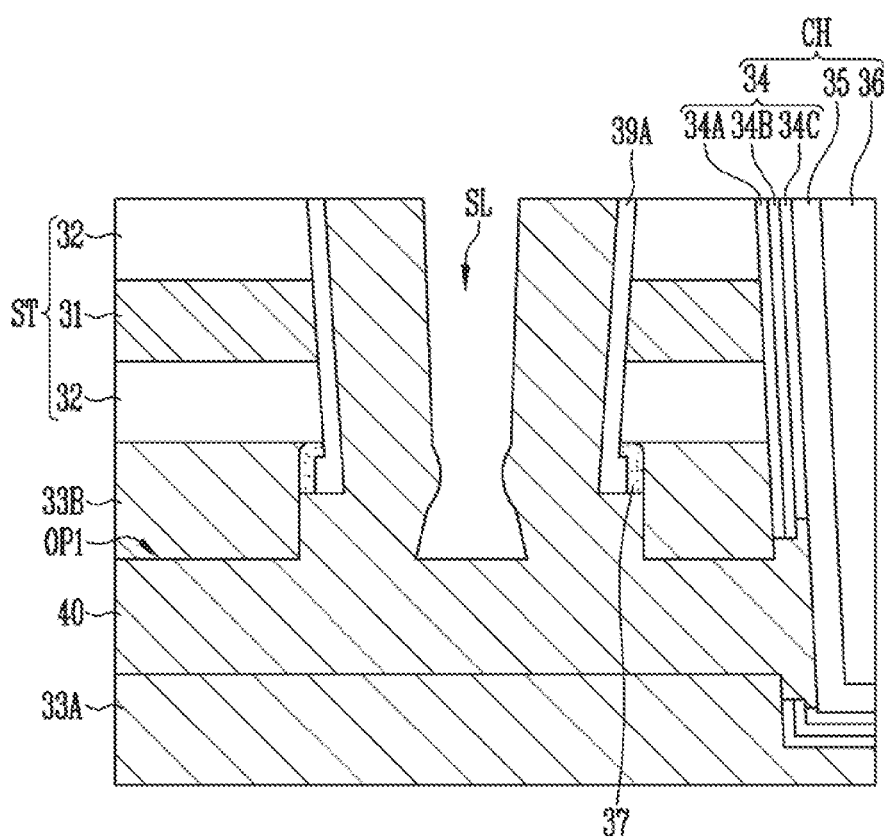
Figure 3H:
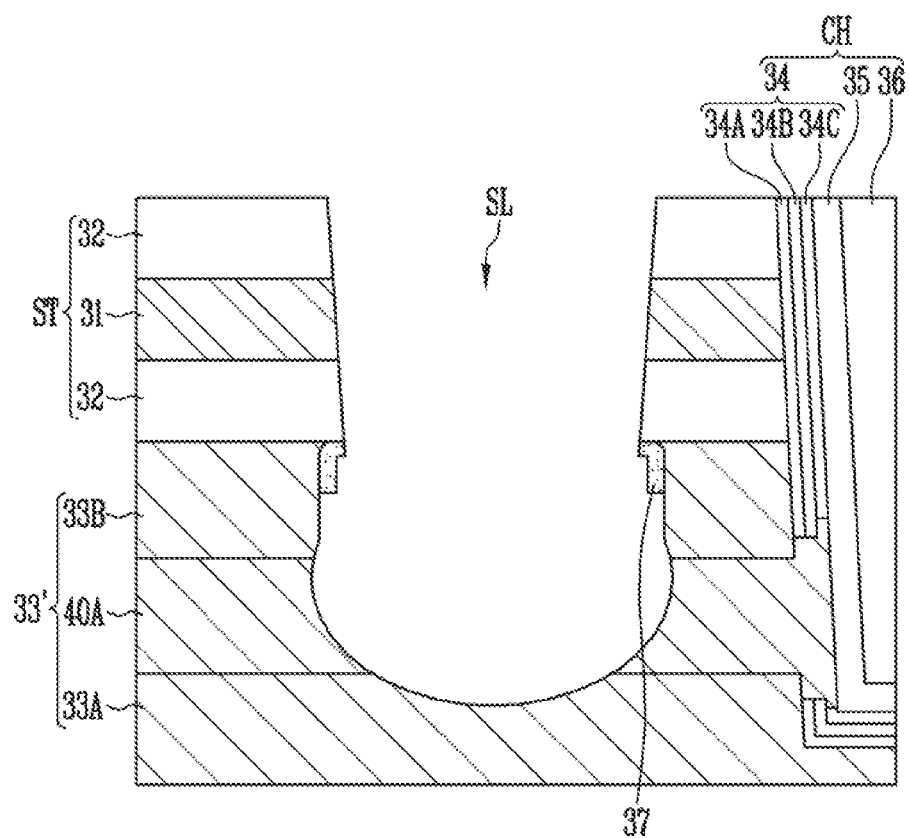
Figure 3I:
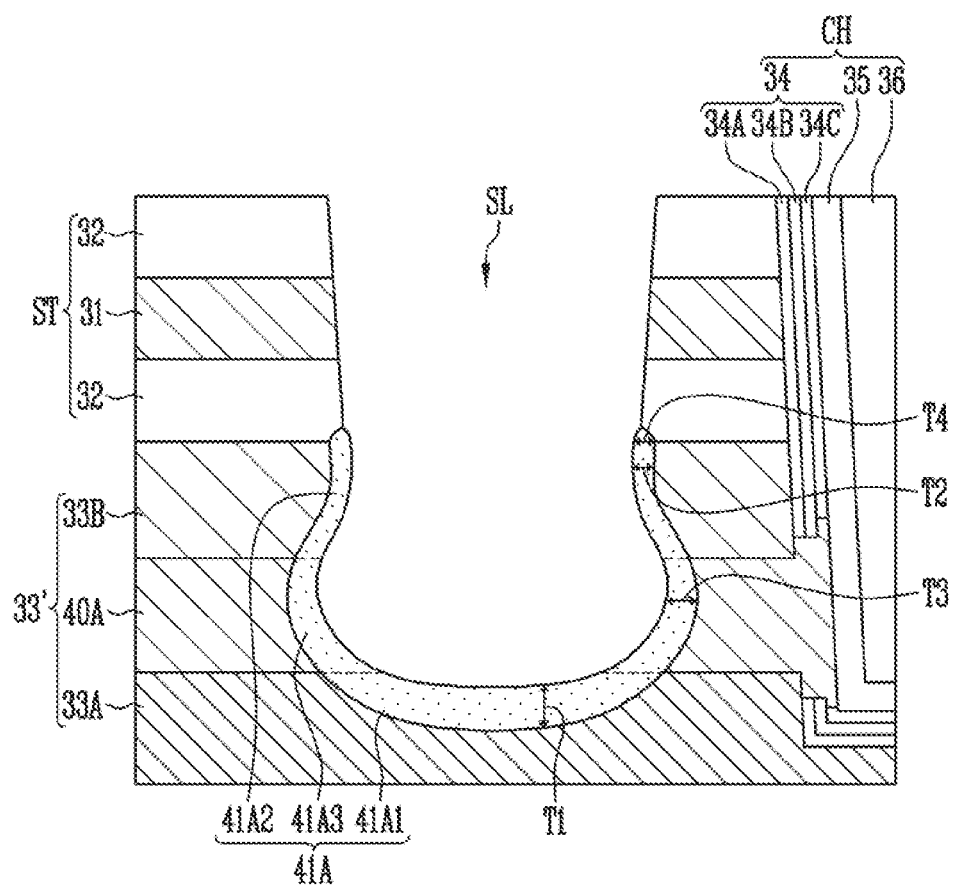
Figure 3J:
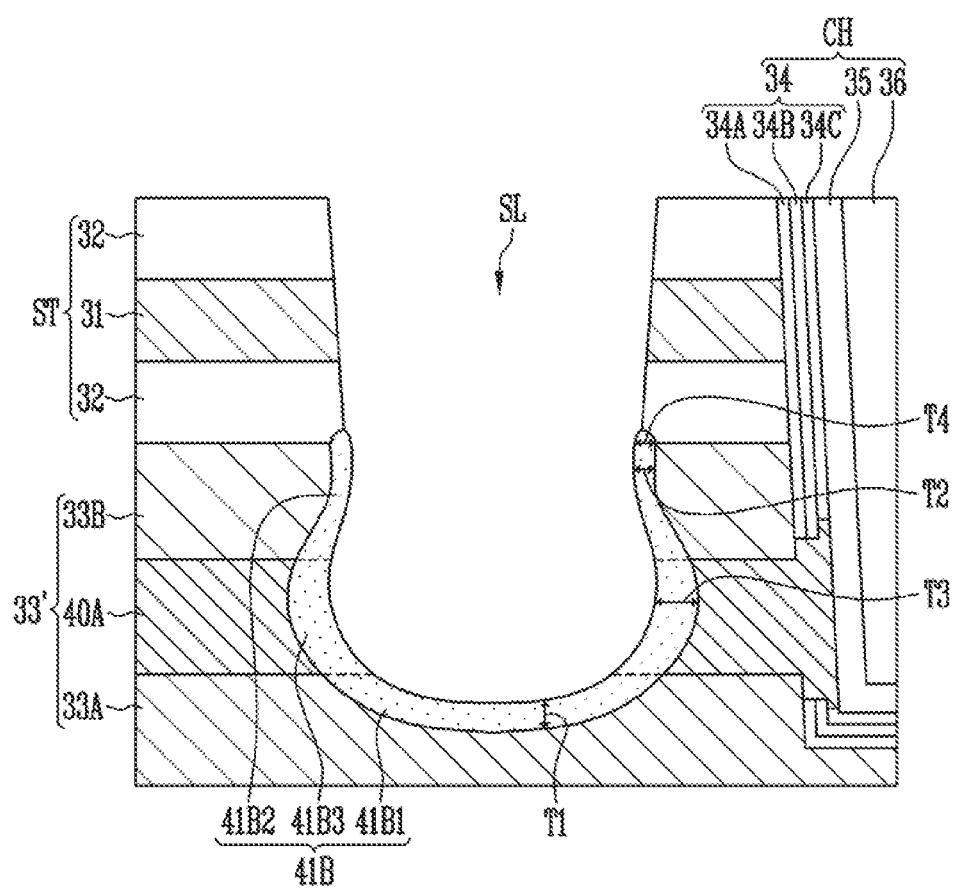
Figure 3K:
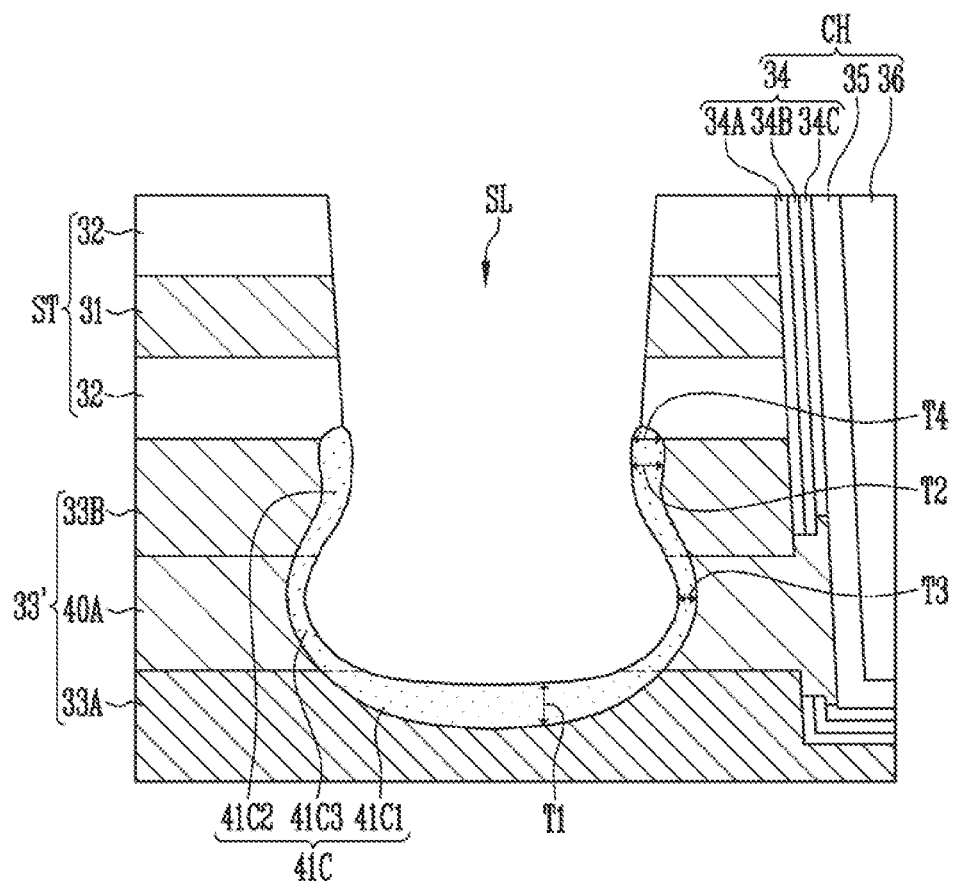
Figure 3L:
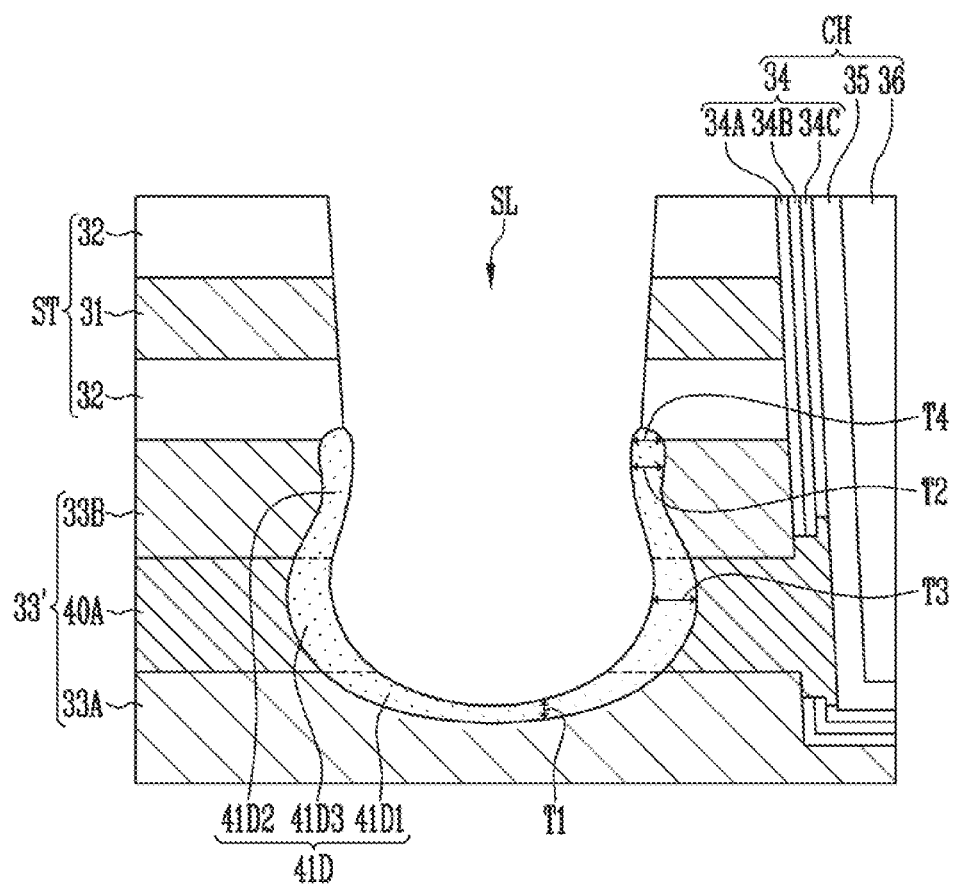
Figure 3M:
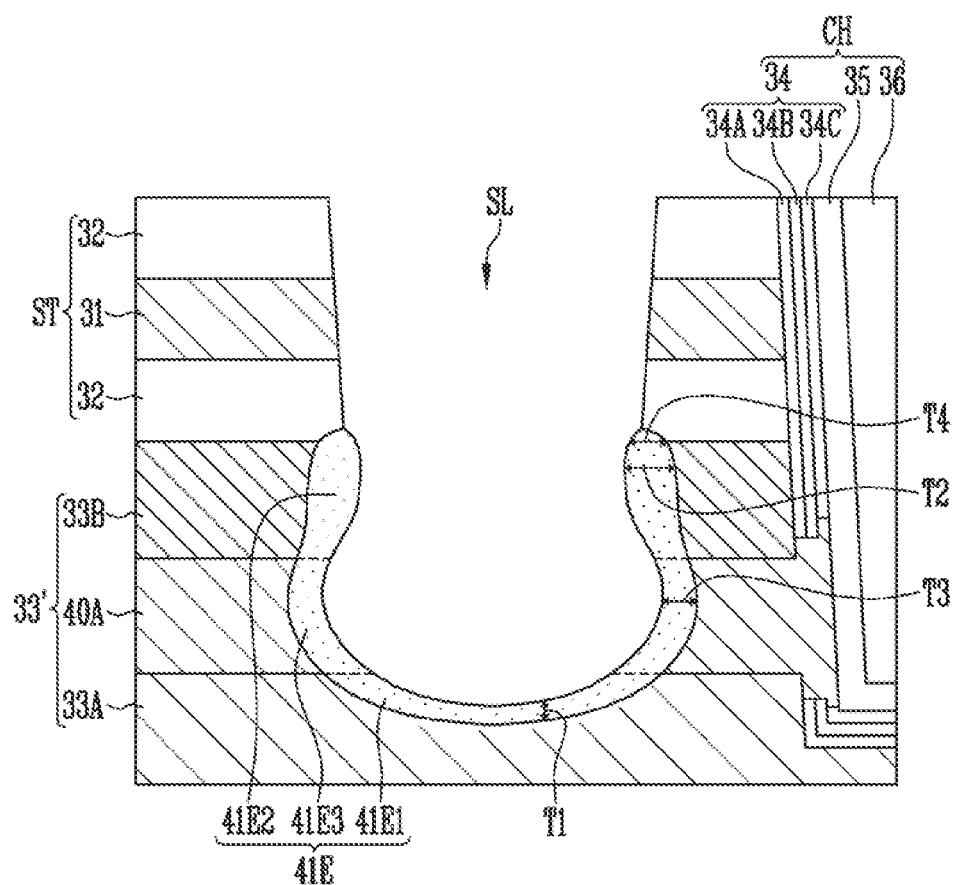
Figure 3N:
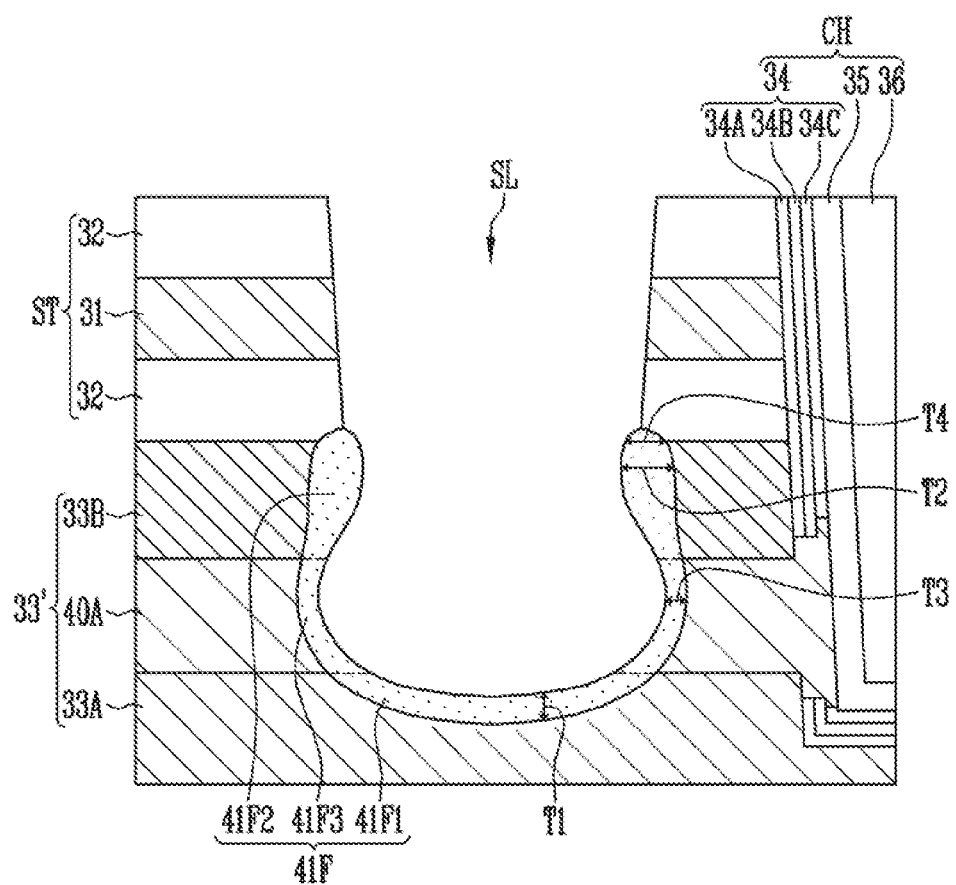
Figure 30:
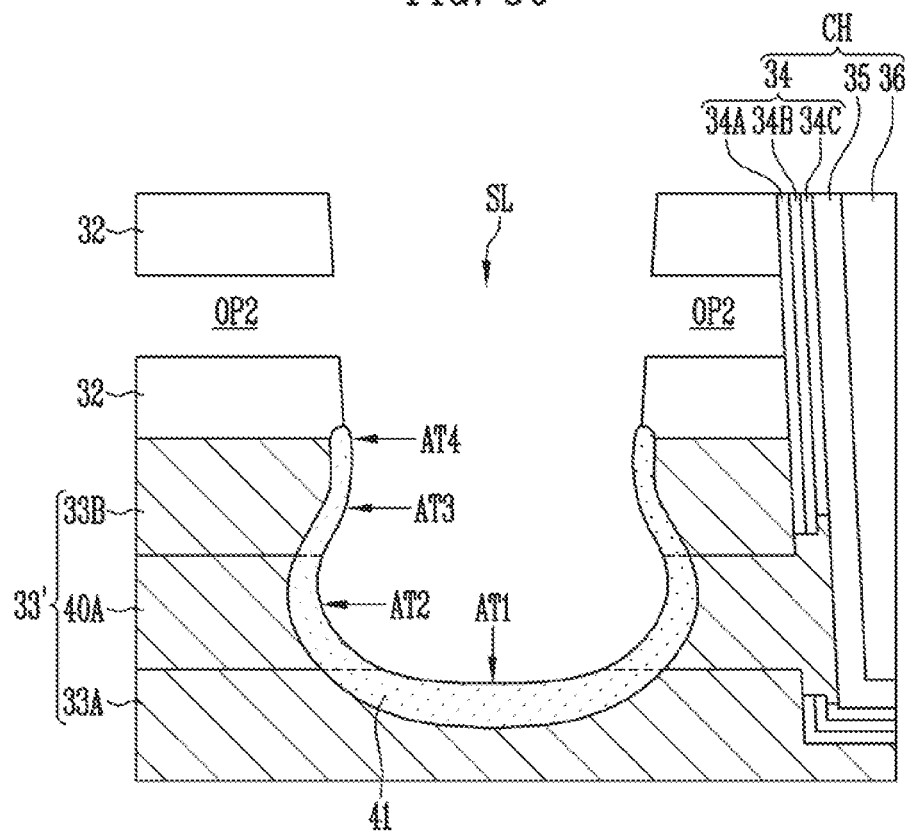
Figure 3P:
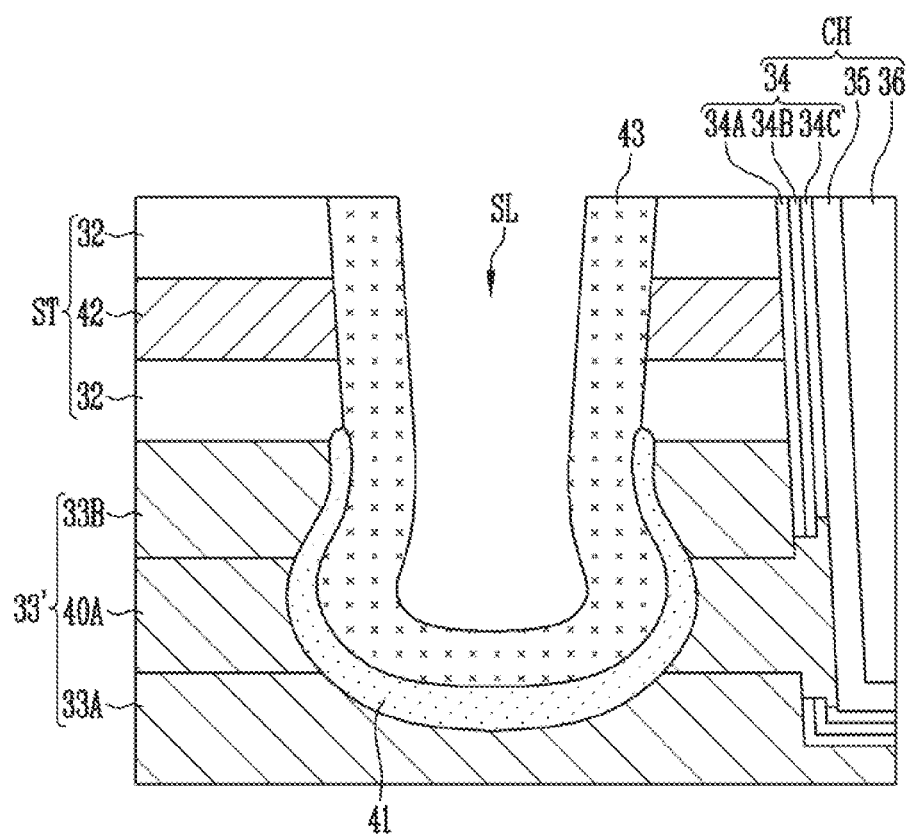
Figure 3Q:
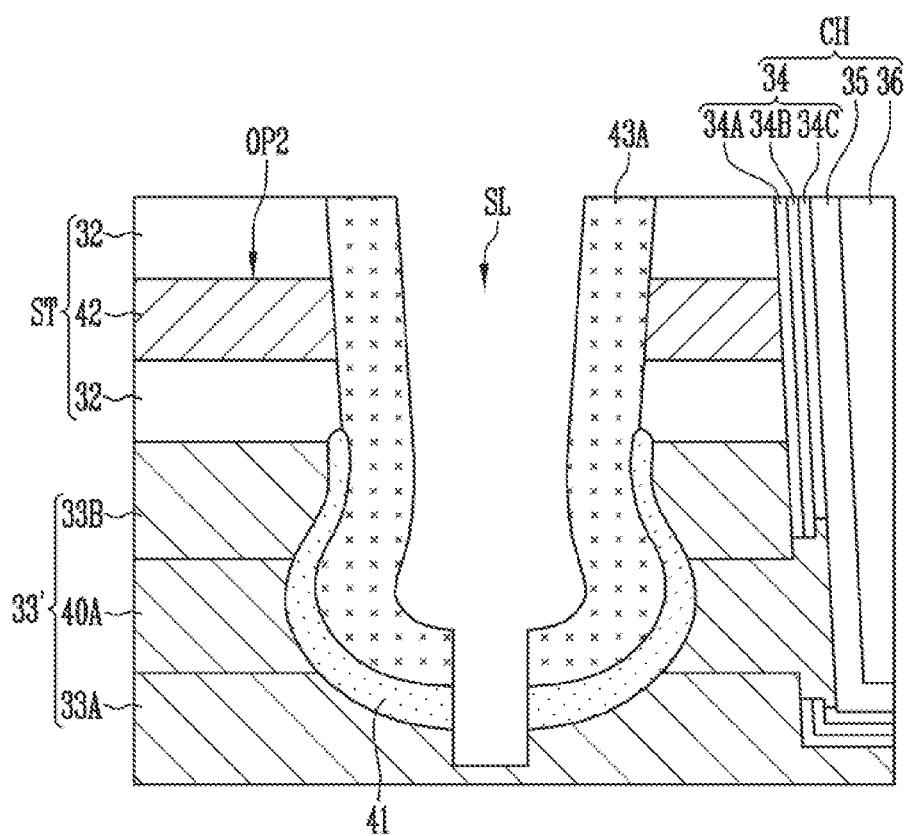
Figure 3R:
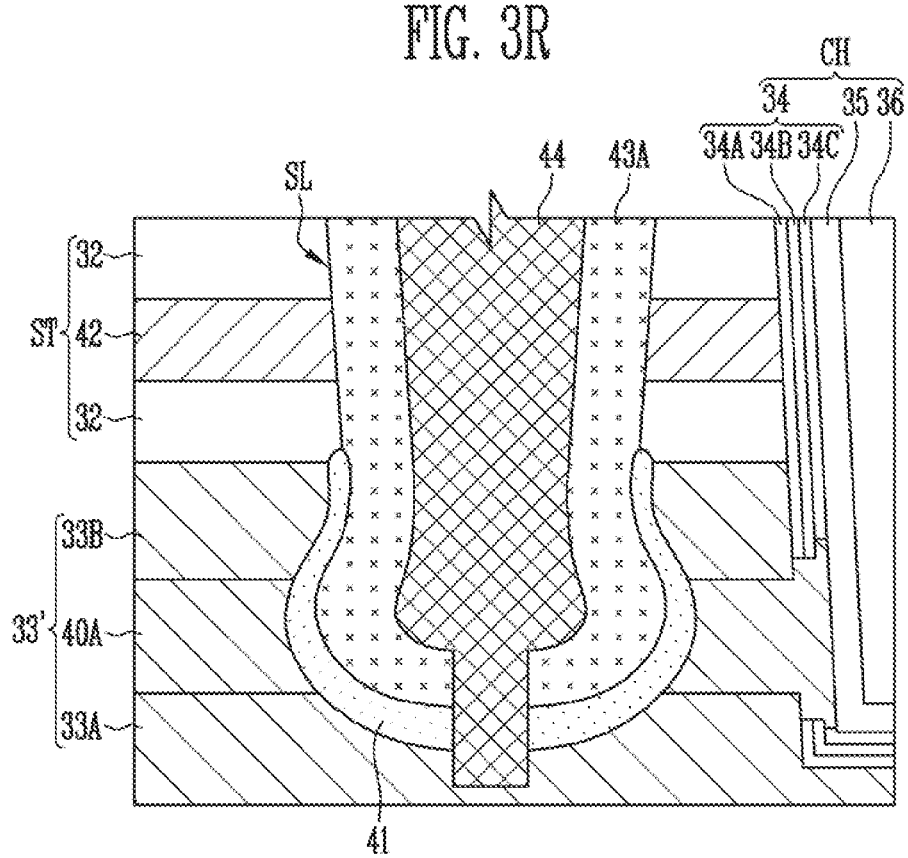

FIGS. 3A to 3R are cross-sectional views illustrating a method of manufacturing a semiconductor device according to an embodiment of the present disclosure. FIGS. 3B to 3R are enlarged sectional views of an area B of FIG. 3A. Hereinafter, any repetitive detailed description of components already mentioned above will be omitted.

Referring to FIGS. 3A and 3B, a source structure 33 including a first sacrificial layer 33C may be formed on a base 30. The source structure 33 may include a first source layer 33A, a second source layer 33B and the first sacrificial layer 33C. In addition, the source structure 33 may further include a second sacrificial layer 33D and a third sacrificial layer 33E. For example, the first source layer 33A, the second sacrificial layer 33D, the first sacrificial layer 33C, the third sacrificial layer 33E, and the second source layer 33B may be sequentially formed on the base 30.

The first sacrificial layer 33C may be provided to ensure an area where a third source layer is formed during subsequent processes. Each of the first source layer 33A, the second source layer 33B, and the first sacrificial layer 33C may be a polysilicon layer. In addition, each of the first source layer 33A, the second source layer 33B, and the first sacrificial layer 33C may or may not include a dopant.

The first sacrificial layer 33C may include a material having a high etch selectivity with respect to the second and third sacrificial layers 33D and 33E. The first sacrificial layer 33C may include a polysilicon layer and the second and third sacrificial layers 33D and 33E may include oxide layers. The second and third sacrificial layers 33D and 33E may include a high-k material such as aluminum oxide $Al_2O_3$.

Subsequently, the stacked structure ST may be formed on the source structure 33. The stacked structure ST may include first material layers 31 and second material layers 32 which are stacked alternately with each other. The first material layers 31 may be provided to form gate electrodes of memory cells or select transistors. The second material layers 32 may be provided to insulate the stacked gate electrodes from each other. The first material layers 31 may include a material having high etch selectivity with respect to the second material layers 32. For example, the first material layers 31 may be sacrificial layers including nitride or the like, and the second material layers 32 may be insulating layers including oxide or the like. In another example, the first material layers 31 may be conductive layers including polysilicon, tungsten, or the like, and the second material layers 32 may be insulating layers including oxide or the like.

Thereafter, channel structures CH may be formed through the stacked structure ST. The channel structure CH may pass through the stacked structure ST and extend into the source structure 13.

A method of forming the channel structures CH will be described below. First, openings may be formed through the stacked structure ST and extend into the source structure 33. Subsequently, memory layers 34 may be formed in the openings. Each of the memory layers 34 may include at least one of a charge blocking layer 34A, a data storing layer 34B, and a tunnel insulating layer 34C. Subsequently, channel layers 35 may be formed in the openings. The channel layers 35 may include gap-filling layers 36.

After an interlayer insulating layer 50 is formed on the stacked structure ST, a slit SL may be formed. The slit SL may pass through the stacked structure ST and extend into the second source layer 33B. The third sacrificial layer 33E and the second source layer 33B may be exposed through the slit SL.

The slit SL may have a uniform thickness W, or may gradually decrease in width toward the bottom. Alternatively, a portion of the slit SL may be wider than the other portions of the slit SL and a protrusion P may be located on the area with a greater width.

The slit SL may be formed in the following manner. First, the slit SL may be formed to a first depth D1 using a primary etch process. The primary etch process may be an anisotropic etch process and a dry etch process. Subsequently, the slit SL may be extended to a second depth D2 using a secondary etch process. The secondary etch process may be an isotropic etch process and a wet etch process. Because the etched area of the second source layer 33B during the primary etch process is etched again during the secondary etch process, the protrusion P may be formed on an inner wall of the slit SL. As shown, the protrusion represents an absence of material whereby the slit includes a cavity in the second source layer. In addition, because the third sacrificial layer 33E is not exposed during the primary etch process, loss of the third sacrificial layer 33E caused during the dry etch process may be prevented. When the third sacrificial layer 33E includes a high-k material, it may be possible to form the slit SL to the second depth D2 by the primary etch process. However, the protrusion P might not be formed on a sidewall of the slit SL.

Referring to FIG. 3C, a preliminary protective pattern 37 may be formed on a sidewall of the second source layer 33B exposed through the slit SL. The preliminary protective pattern 37 may be formed by selectively oxidizing the second source layer 33B. The selective oxidation process may be a wet oxidation process, a dry oxidation process, a radical oxidation process, a plasma oxidation process, or a steam oxidation process. When the dry oxidation process is used, dechloroethylene or trichloroethane (TCA) may be used as a catalyst. The preliminary protective pattern 37 may include an oxide layer.

Subsequently, a spacer material layer 38 may be formed in the slit SL. The spacer material layer 38 may be formed along an inner surface of the slit SL. The spacer material layer 38 may be a multilayer film in which material layers having a high etch selectivity are stacked alternately with each other. The spacer material layer 38 may include a first spacer material layer 38A, a second spacer material layer 38B, and a third spacer material layer 38C. The first spacer material layer 38A and the third spacer material layer 38C may include a material having a high etch selectivity with respect to the second spacer material layer 38B. Each of the first and third spacer material layers 38A and 38C may include a nitride layer and the second spacer material layer 38B may include an oxide layer.

Referring to FIG. 3D, a spacer 39 may be formed by etching the spacer material layer 38. The spacer material layer 38 may be etched using an etchback process. The third sacrificial layer 33E may be etched when the spacer material layer 38 is etched, so that the first sacrificial layer 33C may be exposed. The spacer 39 may include a first spacer 39A, a second spacer 39B, and a third spacer 39C.

Referring to FIG. 3E, a first opening OP1 may be formed by removing the first sacrificial layer 33C through the slit SL. The first sacrificial layer 33C may be selectively removed using a dip-out process. When the first sacrificial layer 33C is removed, the first source layer 33A and the second source layer 33B may be protected by the second sacrificial layer 33D and the third sacrificial layer 33E, respectively.

Referring to FIG. 3F, the memory layer 34 exposed through the first opening OP1 may be etched. As a result, the channel layer 35 may be exposed through the first opening OP1. First, the charge blocking layer 34A may be removed using a dry cleaning process. When the charge blocking layer 34A is removed, the second and third sacrificial layers 33D and 33E may also be removed. As a result, the first and second source layers 33A and 33B may be exposed through the first opening OP1. Subsequently, the data storing layer 34B may also be removed using a dip-out process. When the data storing layer 34B is removed, the third spacer 39C may also be removed. Subsequently, the tunnel insulating layer 34C may be removed using a dry cleaning process. When the tunnel insulating layer 34C is removed, the second spacer 39B may also be removed. The first spacer 39A and the preliminary protective pattern 37 may be partially removed when the memory layer 34 is removed, and may remain on the inner wall of the slit SL.

Referring to FIG. 3G, a conductive layer 40 may be formed in the slit SL and the first opening OP1. The conductive layer 40 may include a polysilicon layer. The conductive layer 40 may be formed using a deposition process. The conductive layer 40 may be thick enough to fill the first opening OP1 and open a central area of the slit SL. The conductive layer 40 may include a seam which is located in the first opening OP1.

Referring to FIG. 3H, a portion of the conductive layer 40 which is formed in the slit SL may be removed. The conductive layer 40 may be etched using a wet etch process. As a result, the first sacrificial layer 33C of the source structure 33 may be replaced by a third source layer 40A, so that a source structure 33' including the first, second, and third source layers 33A, 33B, and 40A may be formed.

When the conductive layer 40 is etched, the first source layer 33A and the second source layer 33B may also be etched. An etched surface of the source structure 33' may have the shape of a bulb. When the conductive layer 40 is etched, the first spacer 39A may protect the stacked structure ST. The first spacer 39A may be removed using a strip process after the conductive layer 40 is etched.

Referring to FIGS. 3I to 3N, protective patterns 41A to 41F, respectively, may be formed by selectively oxidizing the source structure 33'. An etched surface of the source structure 33' may be oxidized using the selective oxidation process, and the protective patterns 41A to 41F may be formed on the etched surface.

The selective oxidation process may be a wet oxidation process, a dry oxidation process, a radical oxidation process, a plasma oxidation process, or a steam oxidation process. When the selective oxidation process is used, only the source structure 33' might be selectively oxidized without oxidizing the first and second material layers 31 and 32. Oxidation of the first material layers 31 including the nitride layers may be prevented. When the dry oxidation process is used, dechloroethylene or trichloroethane (TCA) may be used as a catalyst.

The thickness of the protective patterns 41A to 41F may be affected by the concentration or kind of the dopant of the first, second, and third source layers 33A, 33B, and 40A. Therefore, when the first source layer 33A, the second source layer 33B, and the third source layer 40A are formed, the protective patterns 41A to 41F having various shapes may be formed by controlling the concentration and kind of the dopant included in each layer. Hereinafter, the protective patterns 41A to 41F having various shapes will be described with reference to the respective drawings. In addition, for convenience of explanation, a description will be made on the assumption that the source structure 33' includes a dopant which increases an oxidation rate.

Referring to FIG. 3I, the protective pattern 41A may include a first area 41A1, a second area 41A2, and a third area 41A3. The first source layer 33A may have a higher dopant concentration than the third source layer 40A and the third source layer 40A may have a higher dopant concentration than the second source layer 33B. Therefore, the first area 41A1 may have a greater thickness than the third area 41A3 (T1>T3) and the third area 41A3 may have a greater thickness than the second area 41A2 (T3>T2).

The second area 41A2 may include an interface between the second source layer 33B and the stacked structure ST. Because the second source layer 33B is not sufficiently oxidized at the above interface, the protective pattern 41A might not be formed, or may have a smaller thickness than another area. Therefore, according to an embodiment, the preliminary protective pattern is previously formed, and in this state, the protective pattern 41A may be formed by secondarily oxidizing the interface.

As a result, the second area 41A2 may cover the interface between the source structure 33' and the stacked structure ST. The second area 41A2 may have a sufficient thickness at the above interface. The second area 41A2 may have a thickness ranging from 40 Å to 80 Å. The second area 41A2 may have a convex shape.

Referring to FIG. 3J, the protective pattern 41B may include a first area 41B1, a second area 41B2, and a third area 41B3. The third source layer 40A may have a higher dopant concentration than the first source layer 33A and the first source layer 33A may have a higher dopant concentration than the second source layer 33B. Therefore, the third area 41B3 may have a greater thickness than the first area 41B1 (T3>T1) and the first area 41B1 may have a greater thickness than the second area 41B2 (T1>T2).

Referring to FIG. 3K, the protective pattern 41C may include a first area 41C1, a second area 41C2, and a third area 41C3. The first source layer 33A may have a higher dopant concentration than the second source layer 33B and the second source layer 33B may have a higher dopant concentration than the third source layer 40A. Therefore, the first area 41C1 may have a greater thickness than the second area 41C2 (T1>T2) and the second area 41C2 may have a greater thickness than the third area 41C3 (T2>T3).

Referring to FIG. 3L, the protective pattern 41D may include a first area 41D1, a second area 41D2, and a third area 41D3. The third source layer 40A may have a higher dopant concentration than the second source layer 33B and the second source layer 33B may have a higher dopant concentration than the first source layer 33A. Therefore, the third area 41D3 may have a greater thickness than the second area 41D2 (T3>T2) and the second area 41D2 may have a greater thickness than the first area 41D1 (T2>T1).

Referring to FIG. 3I, the protective pattern 41D may include a first area 41D1, a second area 41D2, and a third area 41D3. The third source layer 40A may have a higher dopant concentration than the second source layer 33B and the second source layer 33B may have a higher dopant concentration than the first source layer 33A. Therefore, the third area 41D3 may have a greater thickness than the second area 41D2 (T3>T2) and the second area 41D2 may have a greater thickness than the first area 41D1 (T2>T1).

Referring to FIG. 3M, the protective pattern 41E may include a first area 41E1, a second area 41E2, and a third area 41E3. The second source layer 33B may have a higher dopant concentration than the third source layer 40A and the third source layer 40A may have a higher dopant concentration than the first source layer 33A. Therefore, the second area 41E2 may have a greater thickness than the third area 41E3 (T2>T3) and the third area 41E3 may have a greater thickness than the first area 41E1 (T3>T1).

Referring to FIG. 3N, the protective pattern 41F may include a first area 41F1, a second area 41F2, and a third area 41F3. The second source layer 33B may have a higher dopant concentration than the first source layer 33A and the first source layer 33A may have a higher dopant concentration than the third source layer 40A. Therefore, the the second area 41F2 may have a greater thickness than the first area 41F1 (T2>T1) and the first area 41F1 may have a greater thickness than the third area 41F3 (T1>T3).

Subsequently, referring to FIG. 3O, second openings OP2 may be formed by selectively removing the first material layers 31 through the slit SL. For example, the first material layers 31 may be selectively etched using a wet etch process using phosphorous.

When the first material layers 31 are etched, the source structure 33' may be damaged by an etchant. An area of the source structure 33' which is damaged by the etchant may be determined by various factors such as etch process conditions, a stack layer configuration, and the shape of an etched surface. For example, the etchant may permeate into the first source layer 33A exposed on the bottom surface of the slit SL to damage the first source layer 33A (AT1). When the etched surface of the source structure 33' has a bulb shape, the etchant may permeate into the widest portion of the bulb and the third source layer 40A corresponding thereto may be damaged (AT2). When the third source layer 40A includes a seam therein, the etchant may be introduced into the seam of the third source layer 40A (AT2). The etchant may permeate into the connection portion where the slit SL and the etched surface having the bulb shape are connected to damage the second source layer 33B corresponding thereto (AT3). Otherwise, the etchant may permeate into the interface between the source structure 33' and the stacked structure ST to damage the second source layer 33B (AT4).

Therefore, according to an embodiment of the present disclosure, the protective pattern 41 may be formed on the etched surface of the source structure 33' to prevent damage of the source structure 33'. The protective pattern 41 may be formed such that an area which is more likely to be damaged may have a greater thickness in consideration of the possibility of damage of each area. The protective pattern 41 may be embodied as the protective patterns 41A to 41F as described above with reference to FIGS. 3I to 3N, respectively.

For example, when the AT1 type has a high possibility of damage, the first area (41A1 to 41C1 and 41F1) may have a relatively great thickness as described above with reference to FIGS. 3I to 3K and 3N. When the AT2 type has a high possibility of damage, the third area (41A3, 41B3, 41D3, and 41E3) may have a relatively great thickness as described above with reference to FIGS. 3I, 3J, 3L, and 3M. For example, when the AT3 type has a high possibility of damage, the second area (41C2 to 41F2) may have a relatively great thickness as described above with reference to FIGS. 3K and 3N, To this end, the dopant concentration of each of the first source layer 33A, the second source layer 33B and the third source layer 40A may be controlled.

Referring to FIG. 3P, third material layers 42 may be formed in the second openings OP2. The third material layers 42 may include a metal film such as tungsten, a silicide layer, a barrier film such as titanium, tantalum, titanium nitride, tantalum nitride, or tungsten nitride, or a combination thereof. In addition, a memory layer may be additionally formed in the second openings OP2 before the third material layers 42 are formed. The memory layer may include at least one of a tunnel insulating layer, a data storing layer, and a charge blocking layer.

Subsequently, a spacer material layer 43 may be formed in the slit SL. The spacer material layer 43 may include an insulating material such as an oxide layer.

Referring to FIG. 3Q, a spacer 43A may be formed by etching the spacer material layer 43. The spacer material layer 43 may be etched using an etchback process. As a result, an area of the spacer material layer 43 which is formed on the bottom surface of the slit SL may be etched and the source structure 33' may be exposed.

Referring to FIG. 3R, a source contact structure 44 may be formed in the slit SL. The source contact structure 44 may be formed in a single layer or multiple layers. For example, after a first conductive layer is formed in the slit SL, the first conductive layer may be etched to a predetermined depth. Subsequently, after a barrier layer is formed on the etched area of the first conductive layer, a second conductive layer may be formed in the barrier layer. The first conductive layer may include a polysilicon layer and the second conductive layer may include a metal layer such as tungsten.

According to the above-described manufacturing method, the protective pattern 41 having a varying thickness depending on an area of the protective pattern 41 may be formed. In addition, the protective pattern 41 may be provided to cover the interfaces between the first, second, and third source layers 33A, 33B, and 40A and the interface between the stacked structure ST and the source structure 33'. Therefore, the source structure 33 may be prevented from being damaged' during the manufacturing processes.

Figure 4A:
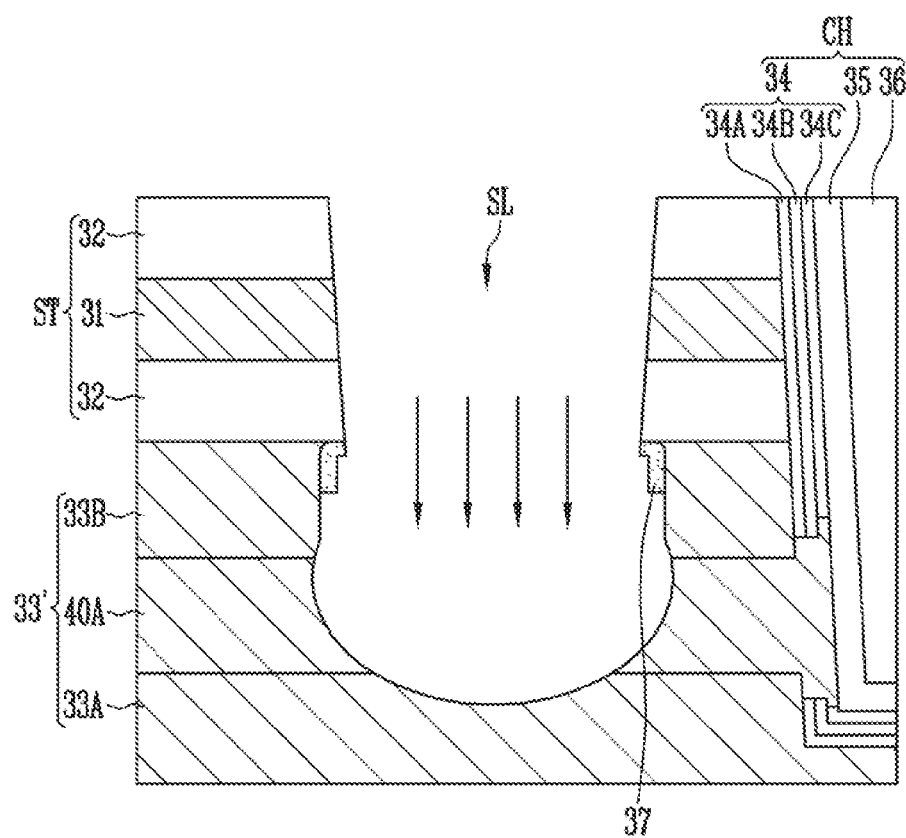
FIGS. 4A and 4B are cross-sectional views illustrating a method of manufacturing a semiconductor device according to an embodiment of the present disclosure.
Figure 4B:
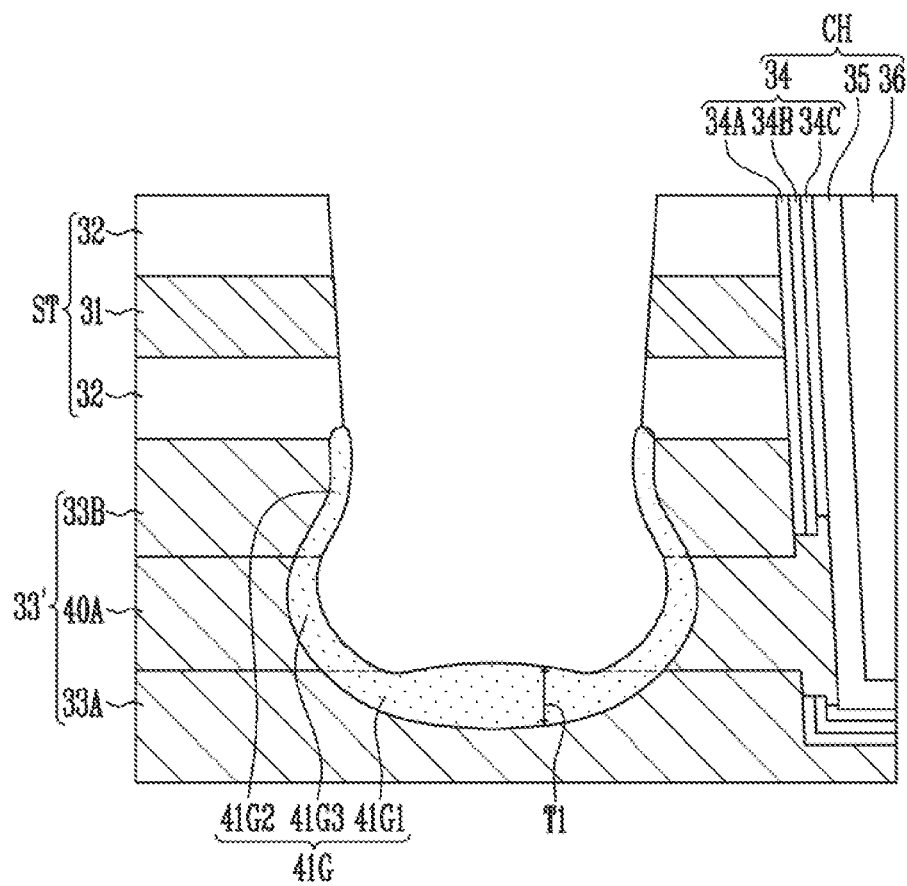

FIGS. 4A and 4B are cross-sectional views illustrating a method of manufacturing a semiconductor device according to an embodiment of the present disclosure. FIG. 4A may correspond to FIG. 3H, and FIG. 4B may correspond to FIGS. 3I to 3N. Hereinafter, any repetitive detailed description of components already mentioned above will be omitted.

Referring to FIG. 4A, a dopant may be injected into the source structure 33' through the slit SL. As described above, the thickness of the protective pattern which varies depending on the area thereof may be affected by the concentration and kind of the dopant of each of the first, second, and third source layers 33A, 33B, and 40A. Therefore, by additionally injecting a dopant into the etched surface of the source structure 33' before the protective pattern is formed, the shape of the protective pattern may be more minutely controlled.

According to an embodiment, a dopant for promoting oxidation may be injected to a desired area where a protective pattern is formed with a relatively great thickness. The dopant may include phosphorous (P), arsenic (As), boron (B), or the like. In another embodiment, a dopant for suppressing oxidation may be injected into an area where a protective pattern is formed with a relatively small thickness. The dopant may include nitrogen (N), carbon (C), or the like.

A dopant may be injected using an ion implantation process. The position at which the dopant is injected may be controlled by controlling the position where ion beams are implanted. By perpendicularly irradiating ion beams, the dopant may be injected into the first source layer 33A. Alternatively, by irradiating ion beams at a tilt angle or a twist angle, the dopant may be injected into the second source layer 33B or the third source layer 40A. For various embodiments, the dopant may be implanted at a concentration of 1E14 to 1E17 atoms/cm$^2$.

Referring to FIG. 4B, the source structure 33' may be selectively oxidized to form a protective pattern 41G. The protective pattern 41G may include a first area 41G1, a second area 41G2, and a third area 41G3. In addition, the dopant additionally injected into the first source layer 33A may allow the first area 41G1 to have a relatively great thickness (T1). The first area 41G1 may have a convex shape.

However, in this embodiment, the dopant implantation process may be performed after the third source layer 40A is formed. However, the present teachings are not limited thereto. The dopant implantation process may be sufficiently performed before the protective pattern 41G is formed. However, the dopant implantation process may be performed before the previous process of FIG. 4A. For example, the dopant may be injected before the third source layer 40A is formed.

Figure 5:
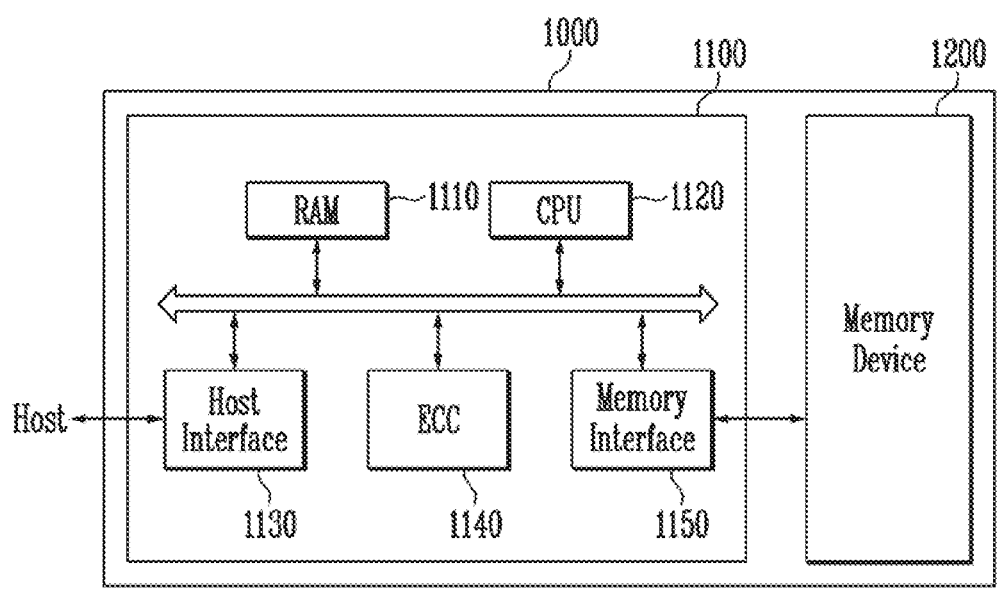
FIG. 5 is a block diagram illustrating a configuration of a memory system according to an embodiment of the present disclosure.

FIG. 5 is a block diagram illustrating a memory system 1000 according to an embodiment.

As illustrated in FIG. 5, the memory system 1000 may include a memory device 1200 and a controller 1100.

The memory device 1200 may be used to store various types of data such as text, graphics, and software codes. The memory device 1200 may be a non-volatile memory device. In addition, the memory device 1200 may include the above configuration described with reference to FIGS. 1 to 4B, and may be manufactured by the method described with reference to FIGS. 1 to 4B. According to an embodiment, the memory device 1200 may include: a source structure; a bit line; a stacked structure between the source structure and the bit line; a source contact structure passing through the stacked structure and electrically coupled to the source structure; and a protective pattern interposed between the source contact structure and the source structure and having a varying thickness depending on an area thereof. Because the memory device 1200 is configured and manufactured in the same manner as described above, a detailed description thereof will not be repeated here.

The controller 1100 may be coupled to a host and the memory device 1200 and configured to access the memory device 1200 in response to a request from the host. For example, the controller 1100 may control read, write, erase, and background operations of the memory device 1200.

The controller 1100 may include a random access memory (RAM) 1110, a central processing unit (CPU) 1120, a host interface 1130, an error correction code (ECC) circuit 1140, and a memory interface 1150.

The RAM 1110 may serve as an operation memory of the CPU 1120, a cache memory between the memory device 1200 and the host, and a buffer memory between the memory device 1200 and the host. For reference, the RAM 1110 may be replaced with a static random access memory (SRAM), a read only memory (ROM), or the like.

The CPU 1120 may control the overall operation of the controller 1100. For example, the CPU 1120 may operate firmware such as a flash translation layer (FTL) stored in the RAM 1110.

The host interface 1130 may interface with the host. For example, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The ECC circuit 1140 may use an error correction code (ECC) to detect and correct errors in data read from the memory device 1200.

The memory interface 1150 may interface with the memory device 1200. For example, the memory interface 1150 may include a NAND interface or a NOR interface.

For reference, the controller 1100 may further include a buffer memory (not shown) for temporarily storing data. The buffer memory may be used to temporarily store data to be transferred from the host interface 1130 to an external device or data to be transferred from the memory interface 1150 to the memory device 1200. In addition, the controller 1100 may further include a ROM that stores code data for interfacing with the host.

Because the memory system 1000 according to the embodiment includes the memory device 1200 having improved integration density and characteristics, the memory system 1000 may also have improved integration density and characteristics accordingly.

Figure 6:
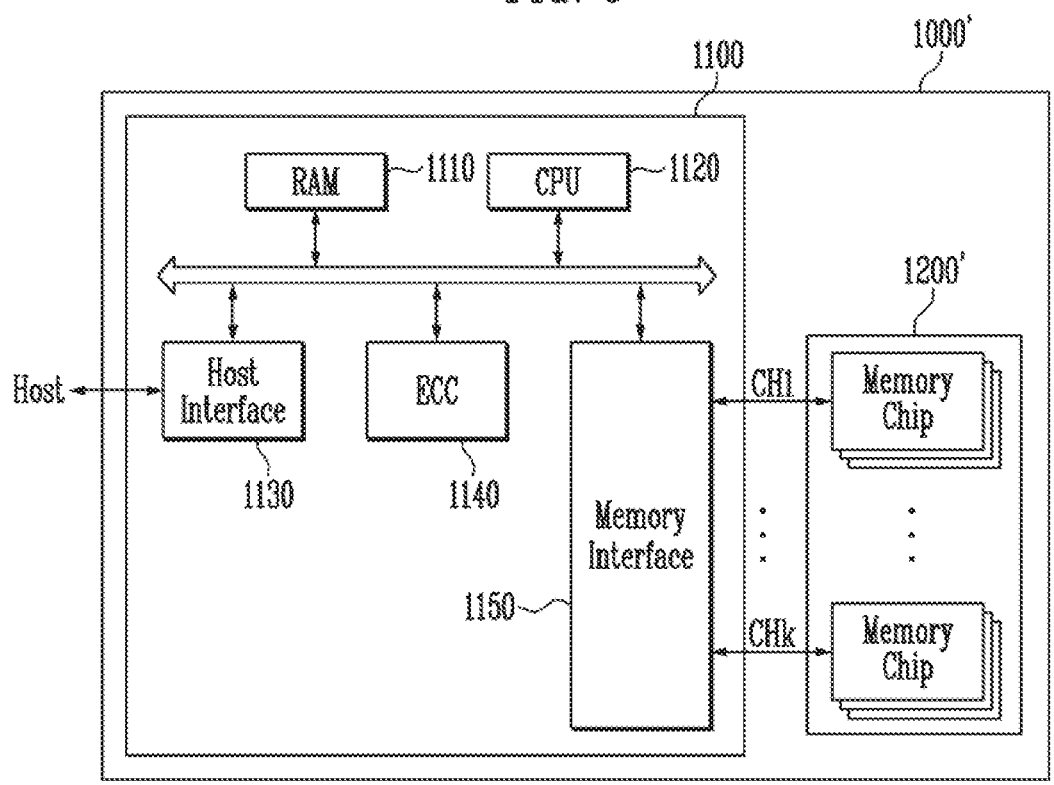
FIG. 6 is a block diagram illustrating a configuration of a memory system according to an embodiment of the present disclosure.

FIG. 6 is a block diagram illustrating the configuration of a memory system 1000' according to an embodiment of the present disclosure. Hereinafter, any repetitive detailed description of components already mentioned above will be omitted.

Referring to FIG. 6, the memory system 1000' may include a memory device 1200' and the controller 1100. The controller 1100 may include a RAM 1110, a CPU 1120, a host interface 1130, an ECC circuit 1140 and a memory interface 1150.

The memory device 1200' may be a non-volatile memory device. In addition, the memory device 1200' may include the above configuration described with reference to FIGS. 1 to 4B, and may be manufactured by the method described with reference to FIGS. 1 to 4B. According to an embodiment, the memory device 1200' may include: a source structure; a bit line; a stacked structure between the source structure and the bit line, a source contact structure passing through the stacked structure and electrically coupled to the source structure; and a protective pattern interposed between the source contact structure and the source structure and having a varying thickness depending on an area thereof. Because the memory device 1200' is configured and manufactured in the same manner as described above, a detailed description thereof will not be repeated here.

Furthermore, the memory device 1200' may be a multi-chip package including a plurality of memory chips. The plurality of memory chips may be divided into a plurality of groups, which may communicate with the controller 1100 through first to kth channels CH1 to CHk, respectively. In addition, memory chips, included in a single group, may be suitable for communicating with the controller 1100 through a common channel. For reference, the memory system 1000' may be modified such that each memory chip may be coupled to a corresponding single channel.

As described above, because the memory system 1000' according to the embodiment includes the memory device 1200' having improved integration and characteristics, the integration and characteristics of the memory system 1000' may also be improved. In particular, the memory device 1200' according to the present embodiment may be formed into a multi-chip package, whereby the data storage capacity and the driving speed thereof may be enhanced.

Figure 7:
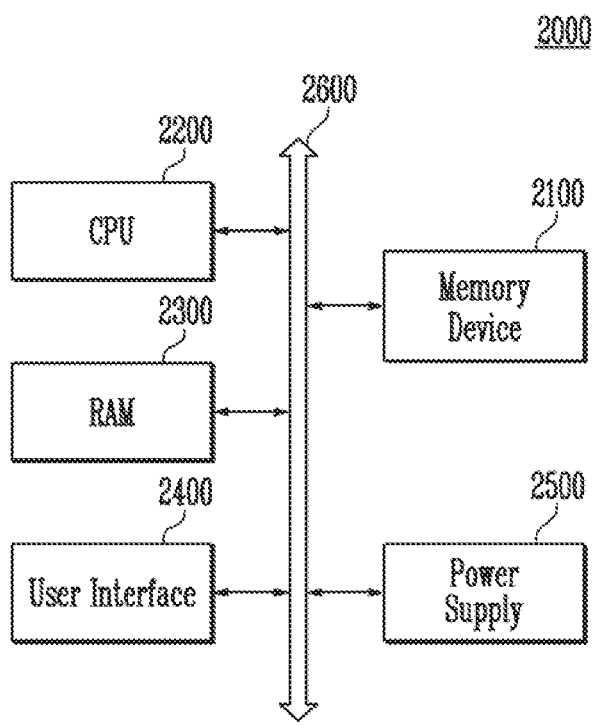
FIG. 7 is a block diagram illustrating a configuration of a computing system according to an embodiment of the present disclosure.

FIG. 7 is a block diagram illustrating the configuration of a computing system 2000 according to an embodiment. Hereinafter, any repetitive detailed description of components already mentioned above will be omitted.

As illustrated in FIG. 7, the computing system 2000 may include a memory device 2100, a CPU 2200, a random-access memory (RAM) 2300, a user interface 2400, a power supply 2500, and a system bus 2600.

The memory device 2100 may store data provided via the user interface 2400, data processed by the CPU 2200, etc. The memory device 2100 may be electrically coupled to the CPU 2200, the RAM 2300, the user interface 2400, and the power supply 2500 by the system bus 2600. For example, the memory device 2100 may be coupled to the system bus 2600 via a controller (not shown), or directly to the system bus 2600. When the memory device 2100 is directly coupled to the system bus 2600, functions of the controller may be performed by the CPU 2200 and the RAM 2300.

The memory device 2100 may be a nonvolatile memory. In addition, the memory device 2100 may include the above configuration described with reference to FIGS. 1 to 4B, and may be manufactured by the method described with reference to FIGS. 1 to 4B. According to an embodiment, the memory device 2100 may include: a source structure; a bit line; a stacked structure between the source structure and the bit line, a source contact structure passing through the stacked structure and electrically coupled to the source structure; and a protective pattern interposed between the source contact structure and the source structure and having a varying thickness depending on an area thereof. Because the memory device 2100 is configured and manufactured in the same manner as described above, a detailed description thereof will be omitted here.

In addition, as described above with reference to FIG. 6, the memory device 2100 may be a multi-chip package composed of a plurality of memory chips.

The computing system 2000 having the above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, because the computing system 2000 according to the embodiment includes the memory device 2100 having improved integration and characteristics, the characteristics of the computing system 2000 may also be improved.

Figure 8:
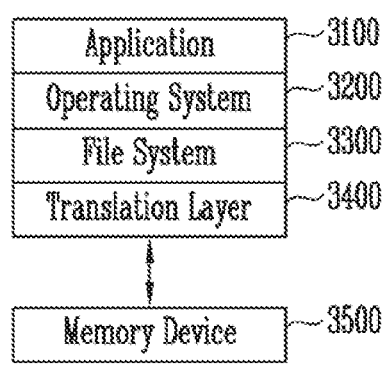
FIG. 8 is a block diagram illustrating a computing system according to an embodiment of the present disclosure.

FIG. 8 is a block diagram illustrating a computing system 3000 according to an embodiment.

As illustrated in FIG. 8, the computing system 3000 may include a software layer that has an operating system 3200, an application 3100, a file system 3300, and a translation layer 3400. The computing system 3000 may include a hardware layer such as a memory device 3500.

The operating system 3200 may manage software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data and store them in the memory device 3500 according to given rules. The file system 3300 may be determined depending on the operating system 3200 used in the computing system 3000. For example, when the operating system 3200 is a Microsoft Windows-based system, the file system 3300 may be a file allocation table (FAT) or an NT file system (NTFS). In addition, the operating system 3200 is a Unix/Linux system, the file system 3300 may be an extended file system (EXT), a Unix file system (UFS), a journaling file system (JFS), or the like.

FIG. 8 illustrates the operating system 3200, the application 3100, and the file system 3300 in separate blocks. However, the application 3100 and the file system 3300 may be included in the operating system 3200.

The translation layer 3400 may translate an address into a suitable form for the memory device 3500 in response to a request from the file system 3300. For example, the translation layer 3400 may translate a logic address, generated by the file system 3300, into a physical address of the memory device 3500. Mapping information of the logical address and the physical address may be stored in an address translation table. For example, the translation layer 3400 may be a flash translation layer (FTL), a universal flash storage link layer (ULL), or the like.

The memory device 3500 may be a nonvolatile memory. In addition, the memory device 3500 may include the above configuration described with reference to FIGS. 1 to 4B, and may be manufactured by the method described with reference to FIGS. 1 to 4B. According to an embodiment, the memory device 3500 may include: a source structure; a bit line; a stacked structure between the source structure and the bit line; a source contact structure passing through the stacked structure and electrically coupled to the source structure; and a protective pattern interposed between the source contact structure and the source structure and having a varying thickness depending on an area thereof. Because the memory device 3500 is configured and manufactured in the same manner as described above, a detailed description thereof will be omitted here.

The computing system 3000 having the above-described configuration may be divided into an operating system layer that is operated in an upper layer region and a controller layer that is operated in a lower level region. The application 3100, the operating system 3200, and the file system 3300 may be included in the operating system layer, and may be driven by an operating memory of the computing system 3000. The translation layer 3400 may be included in the operating system layer or the controller layer.

As described above, because the computing system 3000 according to the embodiment includes the memory device 3500 having improved integration density and characteristics, characteristics of the computing system 3000 may also be improved.

In accordance with various embodiments of the present teachings, a semiconductor device having a stabilized structure and improved reliability may be provided. In addition, a method of manufacturing a semiconductor device may be simplified with lower manufacturing costs.

It will be apparent to those skilled in the art that various modifications can be made to any of the above-described embodiments of the present teachings without departing from the spirit or scope of the present teachings. Thus, it is intended that the present teachings cover all such modifications provided they come within the scope of the appended claims and their equivalents.

What is claimed is:

1. A semiconductor device, comprising:
a source structure including source layers;
a bit line;
a stacked structure between the source structure and the bit line;
a source contact structure penetrating the stacked structure and electrically coupled to the source structure; and
a protective pattern protecting a surface of the source structure, interposed between the source contact structure and the source structure, and having a varying thickness depending on dopants included in each of the source layers.

2. The semiconductor device of claim 1, wherein the source layers of the source structure include a first source layer spaced apart from the stacked structure, a second source layer adjacent to the stacked structure, and a third source layer interposed between the first source layer and the second source layer, and
wherein the protective pattern includes a first area corresponding to the first source layer, a second area corresponding to the second source layer, and a third area corresponding to the third source layer.

3. The semiconductor device of claim 2, wherein the first area has a greater thickness than each of the second and third areas.

4. The semiconductor device of claim 2, wherein the second area has a greater thickness than each of the first and third areas.

5. The semiconductor device of claim 2, wherein the third area has a greater thickness than each of the first and second areas.

6. The semiconductor device of claim 2, wherein the second area has a convex shape toward the source contact structure.

7. The semiconductor device of claim 2, wherein the second area covers the source contact structure at an interface between the source structure and the stacked structure.

8. The semiconductor device of claim 2, wherein concentrations of the dopants included in the first, second, and third source layers are different from each other.

9. The semiconductor device of claim 1, wherein the protective pattern includes an insulating material.

10. The semiconductor device of claim 1, wherein the protective pattern contacts the source structure.

11. A semiconductor device, comprising:
- a source structure including a first source layer, a second source layer, and a third source layer interposed between the first source layer and the second source layer;
- a bit line;
- a stacked structure between the source structure and the bit line;
- a source contact structure penetrating the stacked structure and electrically coupled to the source structure;
- an insulating spacer surrounding a sidewall of the source contact structure; and
- a protective pattern protecting a surface of the source structure, interposed between the insulating spacer and the source structure and covering the insulating spacer surrounded source contact structure at interfaces between the first, second, and third source layers,
- wherein the protective pattern has a varying thickness depending on dopants included in each of the first to third source layers.

12. The semiconductor device of claim 11, wherein the protective pattern covers the insulating spacer surrounded source contact structure at an interface between the stacked structure and the source structure.

\* \* \* \* \*